(12) United States Patent
Sakai et al.

(10) Patent No.: US 6,229,165 B1
(45) Date of Patent: May 8, 2001

(54) SEMICONDUCTOR DEVICE

(75) Inventors: Tetsushi Sakai, Atsugi; Nobuaki Ieda, Chigasaki; Masayuki Ino, Ebina; Shigeru Nakajima, Chigasaki; Yukio Akazawa, Isehara; Tsuneo Mano, Ebina; Hiroshi Inokawa, Atsugi, all of (JP)

(73) Assignee: NTT Electronics Corporation, Tokyo (JP)

( * ) Notice: Subject to any disclaimer, the term of this patent is extended or adjusted under 35 U.S.C. 154(b) by 0 days.

(21) Appl. No.: 09/143,510

(22) Filed: Aug. 28, 1998

(30) Foreign Application Priority Data

Aug. 29, 1997 (JP) ...................................... 9-235170
Aug. 29, 1997 (JP) ...................................... 9-235171
Aug. 29, 1997 (JP) ...................................... 9-235172

(51) Int. Cl.$^7$ .......................... H01L 31/062; H01L 31/113
(52) U.S. Cl. .......................... 257/291; 257/292; 257/293; 257/294; 257/290
(58) Field of Search ............................... 257/222, 59, 290, 257/291, 292, 293, 294, 447, 460, 462

(56) References Cited

U.S. PATENT DOCUMENTS 5,714,790 * 2/1998 Sakamoto .............................. 257/291

FOREIGN PATENT DOCUMENTS 7-307485   11/1995 (JP) .
8-111542    4/1996 (JP) .

* cited by examiner

Primary Examiner—Sara Crane
Assistant Examiner—Thien F. Tran
(74) Attorney, Agent, or Firm—Pillsbury Winthrop LLP

(57) ABSTRACT

This invention provides a semiconductor device including a silicon layer, an insulating layer formed on the silicon layer, a first semiconductor device formed on the insulating film to convert light into an electric signal, and a second semiconductor device formed on the insulating film, wherein a silicon region is formed in the silicon layer to shield the second semiconductor device from light, and a through hole extending through the silicon layer except for the silicon region to input light to the first semiconductor device is formed in that portion of the silicon layer corresponding to the lower portions of the first and second semiconductor devices.

3 Claims, 16 Drawing Sheets

| | | $V_D$ (V) | 2.0 |
|---|---|---|---|
| | | $V_G$ (V) | 0.2 |
| 4 μm | NON | | 68.25pA |
| | WHITE | | 4086.0pA |
| | 800 | | 771.5pA |
| | 700 | | 834.0pA |
| | 600 | | 755.5pA |
| | 500 | | 737.0pA |

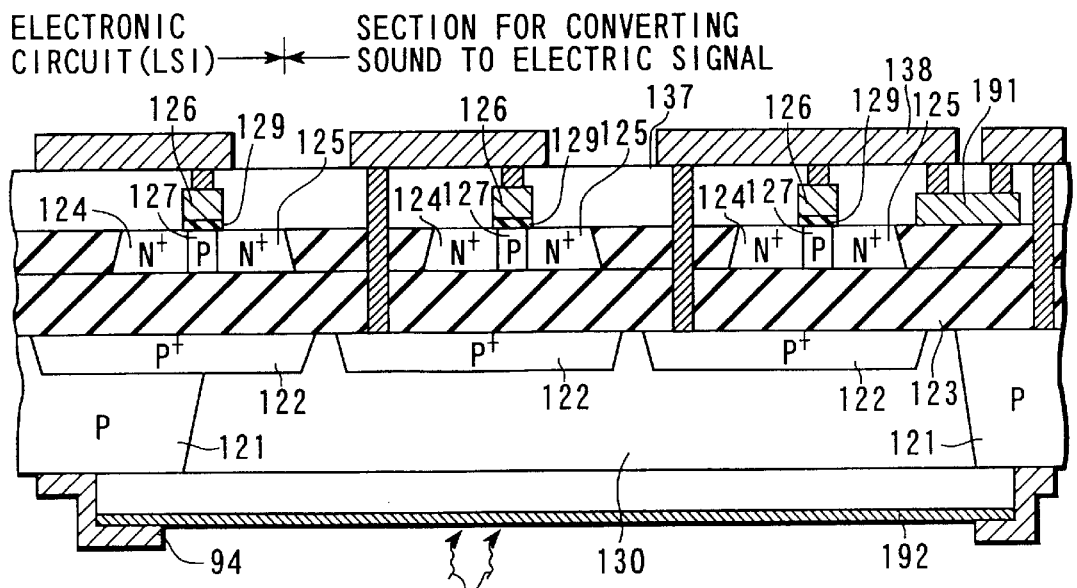
FIG. 12A
FIG. 12B
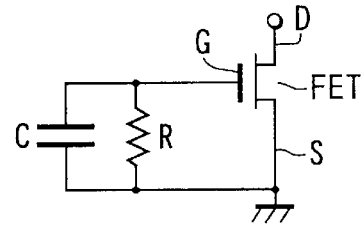
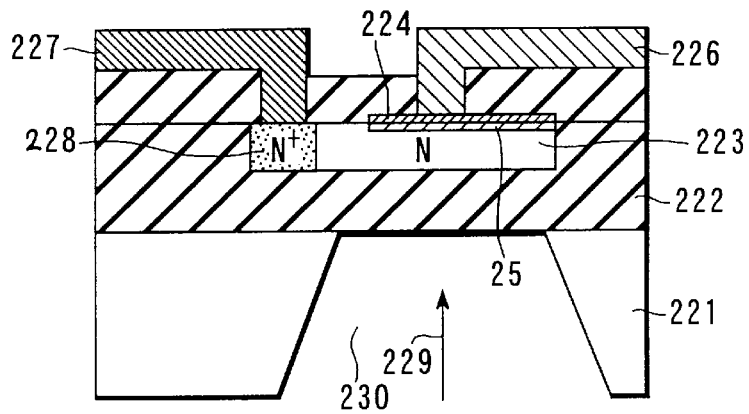
FIG. 13
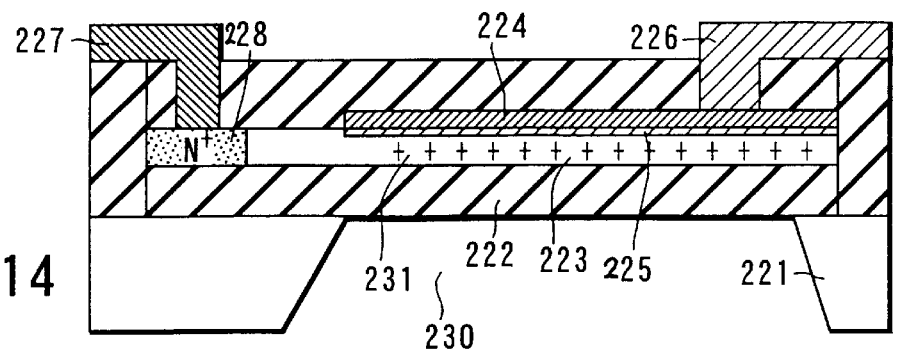
FIG. 14

SEMICONDUCTOR DEVICE

BACKGROUND OF THE INVENTION

The present invention relates to a semiconductor device for converting light and sound to electric signals.

Diodes, lateral bipolar transistors, and MOS transistors are known as a photoreceptor device incorporated in a semiconductor integrated circuit.

FIG. 1 is a sectional view showing a photoreceptor device having a conventional MOS transistor structure.

In FIG. 1, reference numeral 1 denotes a p-type silicon substrate; 2, an $n^+$-type source region; 3, an $n^+$-type drain region; 4, an $n^+$-type polysilicon gate electrode; 5, a gate oxide film; 6, an $SiO_2$ film; 7, an interconnection; 8, an Al light-reflecting film; and 9, light.

The source region 2, the drain region 3, the gate electrode 4, and the gate oxide film 5 constitute a MOS transistor. In the MOS-FET having this structure, a photoelectrically converted signal is detected by changing the current flowing between the drain and source regions.

Since the light 9 is incident on the photoreceptor portion from above the chip, no multilevel interconnection that interrupts the light 9 can be formed. For this reason, the design for a large-scale Integration (LSI) incorporating many photoreceptor devices such as image sensors is greatly limited, and the chip size cannot be decreased.

In recent LSIs, the number of interconnections is increasing to four or five. When a microprocessor, a memory, a logic, and an image sensor are mounted on one chip, the whole chip design is greatly limited because no multilevel interconnection can be formed at the image sensor portion.

Since the light 9 is incident on the upper surface of the silicon substrate from the electrode interconnection side, the light 9 is absorbed and reflected by the electrode interconnection and the gate, resulting in a low photoelectric conversion efficiency.

FIG. 2 is a view showing the layout of a conventional LSI.

In FIG. 2, reference numeral 11 denotes a microprocessor; 12, a logic and a memory; and 13, an image sensor. With an increase in integration degree, a multilevel interconnection made up of three or more layers is desirably formed on the image sensor 13. However, no multilevel interconnection can be formed on the image sensor 13 because light is incident on the silicon substrate from the multilevel interconnection side in the conventional photoreceptor device structure.

When an LSI incorporating a photosensor and an image sensor with a multilayered structure is to be mounted on a logic LSI, a memory LSI, or the like, the upper LSI faces down and is connected to the lower one. Therefore, the conventional LSI incorporating a photosensor and an image sensor cannot be mounted with such a multilayered structure.

FIG. 3 is a view showing a typical CCD as a conventional image sensing device for photographing images.

FIG. 3 shows the state upon applying a clock 3. A potential well 22 is formed in that portion of a silicon substrate 21 facing a gate G of a clock 3, and charges 23 are generated in accordance with the intensity of incident light. An optical signal is converted into an electric signal as a charge amount, and the electric signal is stored in the potential well 22.

After the signal is stored, clocks are cyclicly applied from 3→1→2 to transfer the electric signal rightward in FIG. 3 and output it from the final output stage.

In the image sensing device, since the signal enters the chip from above it, the signal is reflected and absorbed by the gate electrode material, resulting in a low photoelectric conversion efficiency.

BRIEF SUMMARY OF THE INVENTION

The present invention has been made in consideration of the above situation, and has as its object to provide a semiconductor device in which a multilevel interconnection can be formed without considering the light and sound input paths by inputting light and sound to a photoreceptor device from the side opposite to the multilevel interconnection side.

It is another object of the present invention to provide a semiconductor device in which the photoelectric conversion efficiency of the photoreceptor device can be increased by etching away part or all of silicon on the side opposite to an electrode interconnection and entering light into the photoreceptor device.

To achieve the above objects, according to the first aspect of the present invention, there is provided a semiconductor device comprising:

a silicon layer;

an insulating layer formed on the silicon layer;

a first semiconductor device formed on the insulating film to convert light into an electric signal; and a second semiconductor device formed on the insulating film, wherein a silicon region is formed in the silicon layer to shield the second semiconductor device from light, and a through hole extending through the silicon layer except for the silicon region to input light to the first semiconductor device is formed in a portion of the silicon layer corresponding to lower portions of the first and second semiconductor devices.

According to the second aspect of the present invention, there is provided a semiconductor device of the first aspect, wherein a surface of the silicon region is silicided.

According to the third aspect of the present invention, there is provided a semiconductor device of the first aspect, wherein a metal is formed on a surface of the silicon region.

According to the fourth aspect of the present invention, there is provided a semiconductor device of the second aspect, wherein a transparent electrode is formed on the silicided surface of the silicon region and a surface of the insulating film.

According to the fifth aspect of the present invention, there is provided a semiconductor device of the third aspect, wherein a transparent electrode is formed on surfaces of the metal and the insulating film.

According to the sixth aspect of the present invention, there is provided a semiconductor device of the first aspect, further comprising a transparent film covering the through hole.

According to the seventh aspect of the present invention, there is provided a semiconductor device of the first aspect, wherein the first semiconductor device is a Schottky diode.

According to the eighth aspect of the present invention, there is provided a semiconductor device of the seventh aspect, wherein the Schottky diode comprises:

an n-type region;

an $n^+$-type region adjacent to the n-type region; and a Schottky electrode for forming a Schottky junction with the n-type region.

According to the ninth aspect of the present invention, there is provided a semiconductor device of the eighth aspect, wherein an impurity is doped in the n-type region.

According to the 10th aspect of the present invention, there is provided a semiconductor device of the eighth aspect, wherein the n-type region is formed around the n⁺-type region.

According to the 11th aspect of the present invention, there is provided a semiconductor device of the first aspect, wherein the first semiconductor device is a p-n junction diode.

According to the 12th aspect of the present invention, there is provided a semiconductor device of the first aspect, wherein the first semiconductor device is a MOS transistor.

According to the 13th aspect of the present invention, there is provided a semiconductor device comprising:

a silicon layer;

an insulating layer formed on the silicon layer;

a plurality of first semiconductor devices formed on the insulating film to convert light into an electric signal; and a plurality of second semiconductor devices formed on the insulating film, wherein silicon regions are formed in the silicon layer to shield the plurality of second semiconductor devices from light, and a through hole extending through the silicon layer except for the silicon regions to input light to the first semiconductor devices is formed in a portion of the silicon layer corresponding to lower portions of the pluralities of first and second semiconductor devices.

According to the 14th aspect of the present invention, there is provided a semiconductor device of the 13th aspect, wherein the plurality of first semiconductor devices are MOS transistors having a photoelectric conversion function, and the plurality of second semiconductor devices are MOS transistors for reading charges accumulated in the plurality of first semiconductor devices.

According to the 15th aspect of the present invention, there is provided a semiconductor device of the 13th aspect, wherein the plurality of first semiconductor devices are arrayed, and a read circuit for reading charges from a specific first semiconductor device of the plurality of first semiconductor devices by a second semiconductor device corresponding to the specific first semiconductor device is formed on the insulating film.

According to the 16th aspect of the present invention, there is provided a semiconductor device of the 15th aspect, further comprising an output circuit formed on the insulating film to externally output charges read by the read circuit.

According to the 17th aspect of the present invention, there is provided a semiconductor device comprising:

a silicon layer;

an insulating layer formed on the silicon layer;

a MOS transistor formed on the insulating film; and a resistor electrically connected to the silicon layer and a gate of the MOS transistor, wherein a silicon region electrically connected to the gate of the MOS transistor is formed in a portion of the silicon layer below the MOS transistor, a through hole extending through the silicon layer except for the silicon region is formed in a portion of the silicon layer corresponding to a lower portion of the semiconductor device, a conductive film covering the through hole is formed on the silicon layer, and a capacitor formed by the conductive film and the silicon region changes in capacitance upon reception of sound, thereby changing a gate voltage of the MOS transistor.

According to the 18th aspect of the present invention, there is provided a semiconductor device of the 17th aspect, wherein the conductive film is an electret film.

According to the 19th aspect of the present invention, there is provided a semiconductor device of the 17th aspect, wherein holes for keeping pressures inside and outside the through hole constant are formed in the conductive film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12A is a sectional view showing a semiconductor device according to the fourth embodiment of the present invention;

FIG. 12B is an equivalent circuit diagram of one MOS transistor in the semiconductor device shown in FIG. 12A;

FIG. 13 is a sectional view showing a semiconductor device according to the fifth embodiment of the present invention;

FIG. 14 is a sectional view showing another structure of the semiconductor device according to the fifth embodiment of the present invention;

DETAILED DESCRIPTION OF THE INVENTION

Embodiments of the present invention will be described in detail below with reference to the several views of the accompanying drawing.

<First Embodiment>

Figure 1:
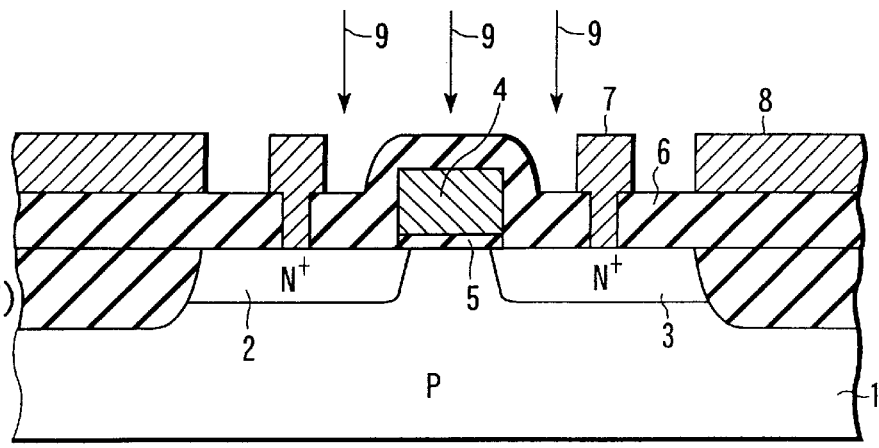
FIG. 1 is a sectional view showing a photoreceptor device having a conventional MOS transistor structure.
Figure 2:
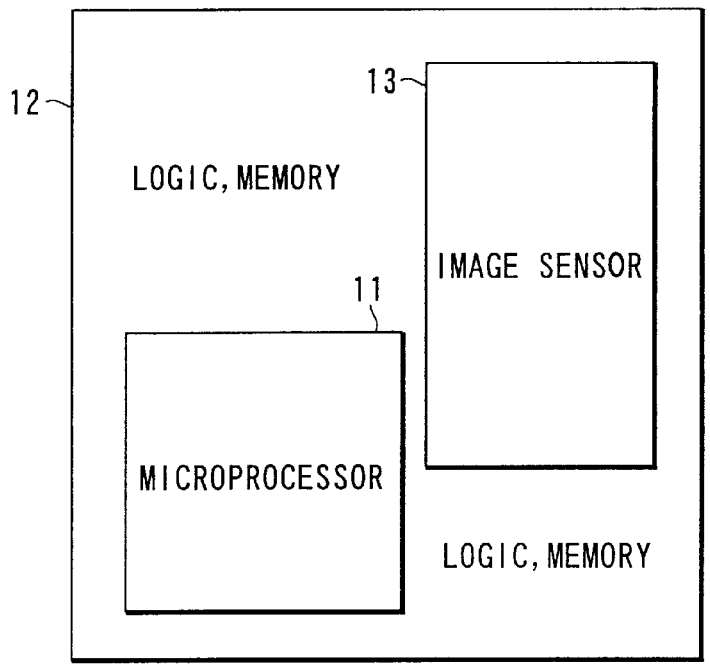
FIG. 2 is a view showing the layout of a conventional LSI.
Figure 3:
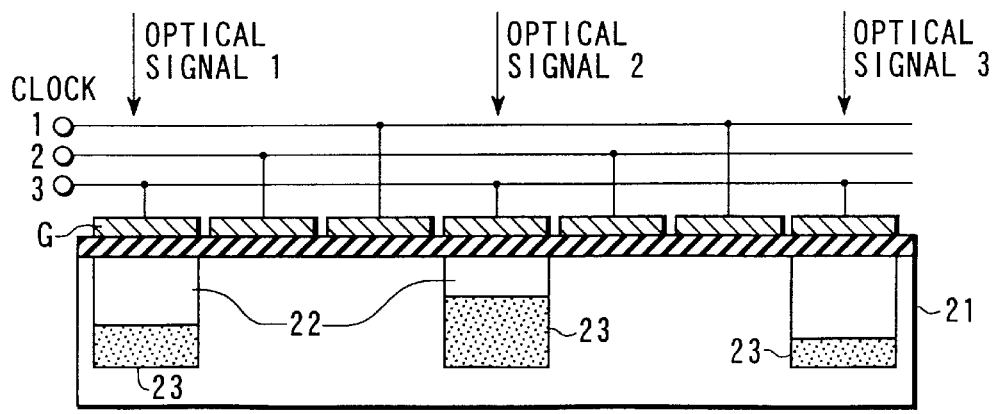
FIG. 3 is a view showing a typical CCD as a conventional image sensing device for photographing images.
Figure 4:
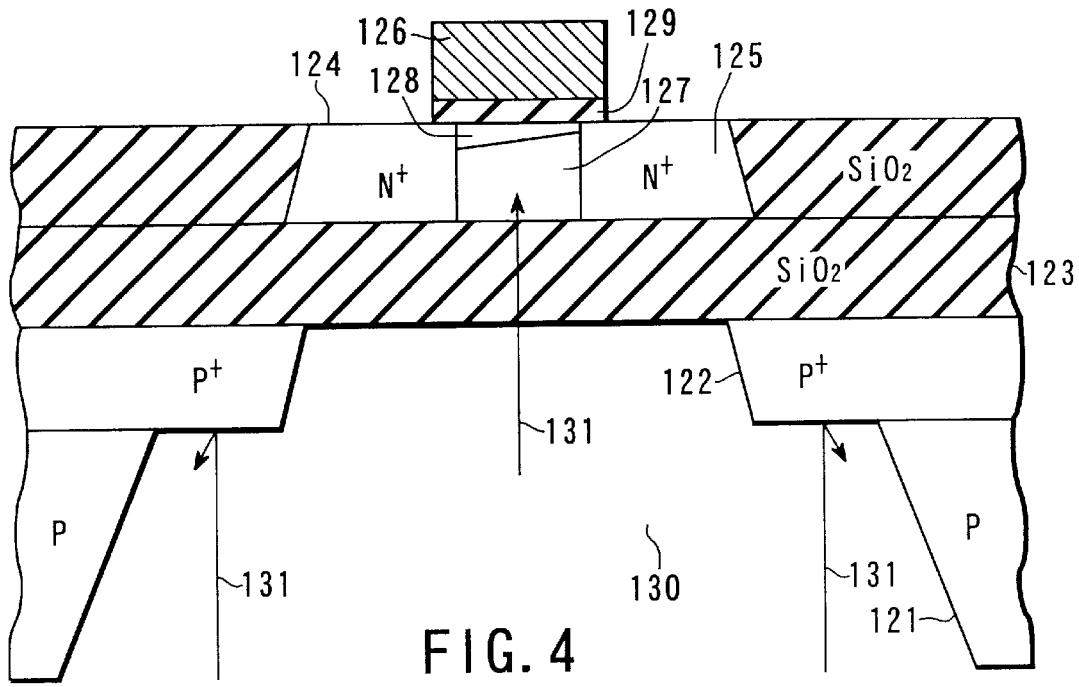
FIG. 4 is a sectional view showing a semiconductor device according to the first embodiment of the present invention.

FIG. 4 is a sectional view showing a MOS transistor according to the first embodiment of the present invention.

In FIG. 4, reference numeral 121 denotes a p-type silicon layer; 122, a $p^+$-type region for preventing transmission of light; 123, a buried $SiO_2$ insulating layer; 124, an $n^+$-type source region; 125, an $n^+$-type drain region; 126, a polysilicon gate electrode; 127, a depletion layer region; 128, a channel region; 129, an $SiO_2$ gate film; 130, a hole obtained by partially removing the silicon layer 121; and 131, light entering the hole 130.

The silicon layer 121 and the insulating layer 123 constitute an SOI substrate. The source region 124, the drain region 125, the gate electrode 126, the depletion layer region 127, the channel region 128, and the gate film 129 constitute a full depletion MOS transistor having a single-crystal silicon layer.

The full depletion MOS transistor is connected via a multilevel interconnection. The full depletion MOS transistor is used as a photoreceptor device. The light 131 is directly incident via the hole 130 on the channel region 128 and the depletion layer region 127 immediately below the gate film 129, and converted into an electric signal in these regions.

As the intensity of the light 131 changes, the current flowing between the drain region 125 and the source region 124 changes. As the intensity of the light 131 increases, the current increases.

Figures 6, 7:
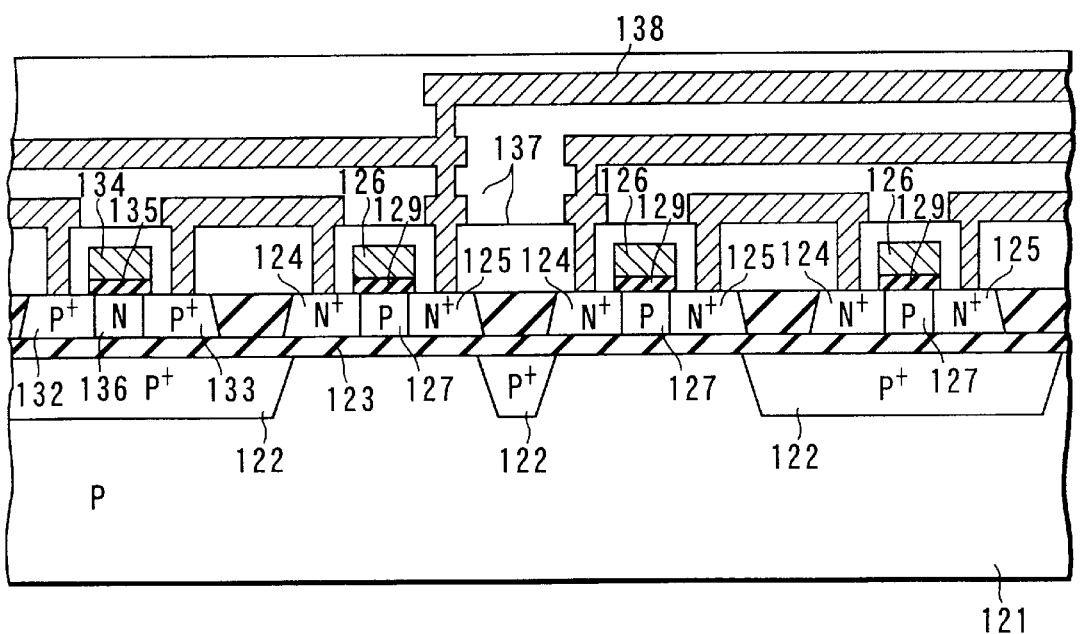
FIG. 6 is a table showing the light wavelength and drain current characteristics of a full depletion MOS transistor according to the first embodiment of the present invention.
FIG. 7 is a sectional view showing the state of a semiconductor device according to the third embodiment of the present invention before anisotropic etching.

FIG. 6 is a table showing the light wavelength and drain current characteristics of the full depletion MOS transistor according to the first embodiment of the present invention.

More specifically, when the gate length is 4 µm, the drain-source voltage $V_D$ is 2.0V, and the gate voltage $V_G$ is 0.2V, the drain current $I_D$ is 68.25 pA for no light, 4086.0 pA for a white light wavelength, 771.5 pA for a light wavelength of 800 nm, 834.0 pA for a light wavelength of 700 nm, 755.5 pA for a light wavelength of 600 nm, and 737.0 pA for a light wavelength of 500 nm.

<Second Embodiment>

Figure 5:
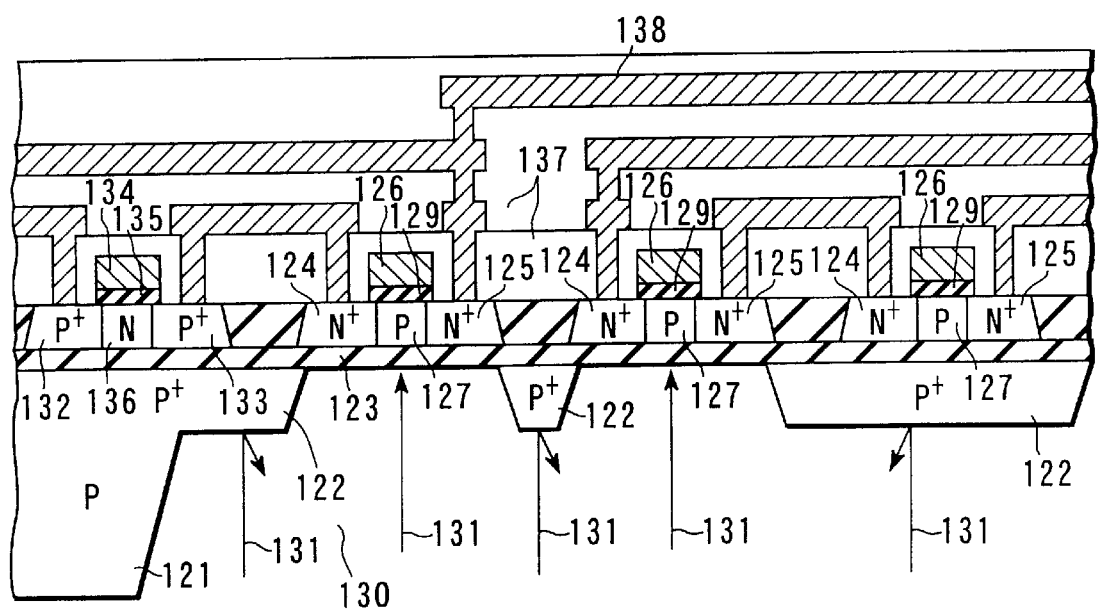
FIG. 5 is a sectional view showing a semiconductor device according to the second embodiment of the present invention.

FIG. 5 is a sectional view showing a semiconductor device according to the second embodiment of the present invention in which a photoreceptor device is incorporated in an LSI. The same reference numerals as in FIG. 4 denote the same parts in FIG. 5, and a description thereof will be omitted.

As shown in FIG. 5, the semiconductor device of the second embodiment is different from the semiconductor device of the first embodiment shown in FIG. 4 in that a plurality of devices are formed in one large hole 130 in the lower surface of a semiconductor substrate.

In FIG. 5, reference numeral 132 denotes a $p^+$-type source region; 133, a $p^+$-type drain region; 134, a polysilicon gate electrode; 135, an $SiO_2$ gate film; 136, an n-type region; 137, an insulating film; and 138, a metal interconnection forming a multilevel interconnection.

The $p^+$-type source region 132, the $p^+$-type drain region 133, the polysilicon gate electrode 134, the $SiO_2$ gate film 135, and the n-type region 136 constitute a p-channel MOS transistor.

Respective MOS transistors are connected by a multilevel interconnection formed from the metal interconnection 138 via the insulating film 137. In a MOS transistor not serving as a photoreceptor device, a $p^+$-type region 122 is formed from a silicon layer 121 below an insulating layer 123 to prevent the light 131 input via the hole 130 from entering the MOS transistor not serving as a photoreceptor device.

In this manner, the light 131 is incident on the full depletion MOS transistor serving as a photoreceptor device from not the multilevel interconnection side but the side opposite to the multilevel interconnection. The multilevel interconnection is independent of the light incident path and can be formed without considering the incident path.

In a full depletion MOS transistor not used as a photoreceptor device, incident light interrupts normal circuit operation. In order to prevent light from adversely affecting circuit operation, light is reflected and absorbed by forming the $p^+$-type region 122 below the buried silicon oxide film of the full depletion MOS transistor except for one used as a photoreceptor device.

<Third Embodiment>

FIG. 7 is a sectional view showing the state before anisotropic etching in a method of manufacturing an LSI incorporating a photoreceptor device obtained by two-dimensionally arranging full depletion MOS transistors in a mesh-like shape and connecting them in parallel.

FIGS. 8 to 11 are sectional views, respectively, showing the state after a hole is formed by anisotropic etching. In FIGS. 8 to 11, the same reference numerals as in FIG. 5 denote the same parts, and a description thereof will be omitted.

As shown in FIG. 7, a single-crystal silicon layer on a buried $SiO_2$ (silicon oxide) insulating layer 123 of a SIMOX (SOI) substrate made up of a p-type silicon layer 121 and the $SiO_2$ insulating layer 123 is oxidized and etched away to decrease the thickness of the single-crystal silicon layer to about 30 to 120 nm.

After devices are isolated using LOCOS, boron is ion-implanted at, e.g., 360 keV and $1\times10^{14}$ to $4\times10^{15}$ ions/cm$^2$ in that region of the p-type silicon layer 121 immediately below the buried $SiO_2$ insulating layer 123 where a photoreception hole is to be formed except for a portion where a full depletion MOS transistor serving as a photoreceptor device is to be formed. The boron-implanted region is activated by annealing to form a $p^+$-type region 122 for preventing transmission of light.

Processing up to formation of a multilevel interconnection by a metal interconnection 138 is the same as conventional CMOS/SIMOX LSI manufacturing processing. The p-type silicon layer 121 on the lower surface of the SIMOX substrate having no multilevel interconnection is polished to decrease the thickness to, e.g., about 100 to 300 µm.

Figure 8:
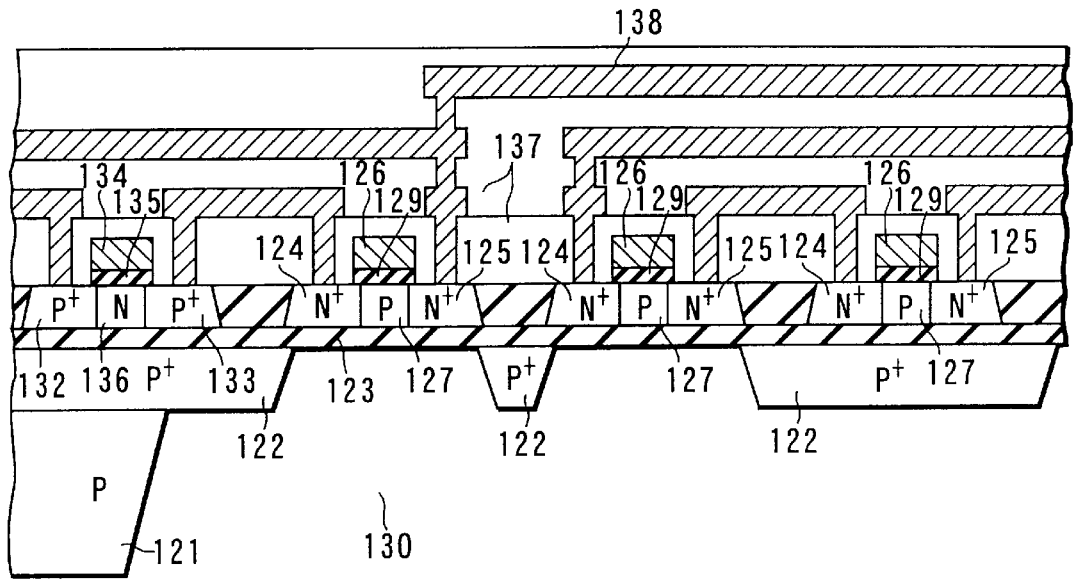
FIG. 8 is a sectional view showing a state of the semiconductor device according to the third embodiment of the present invention after anisotropic etching.

As shown in FIG. 8, the p-type silicon layer 121 on the lower surface almost immediately below a full depletion MOS transistor serving as a photoreceptor device is removed using an anisotropic etching solution to form a hole 130.

As the etching solution, a dimethylamine solution or a KOH-based solution is available. At this time, the buried $SiO_2$ insulating layer 123 is not etched. In addition, the $p^+$-type region 122 is left at a desired portion because the etching rate of the $p^+$-type region 122 formed in advance is lower by two or more orders of magnitude.

Figure 9:
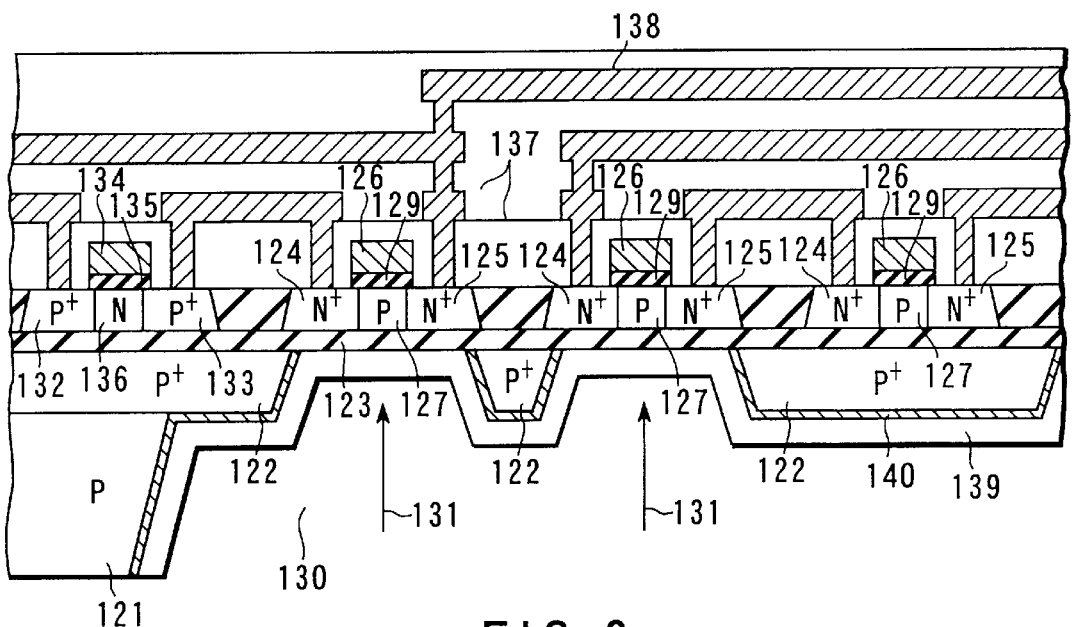
FIG. 9 is a sectional view showing a state of the semiconductor device according to the third embodiment of the present invention after anisotropic etching.

As shown in FIG. 9, a conductive transparent electrode 139 is formed to cover the inner surface in the hole 130 so as to prevent charge-up. The conductive transparent electrode 139 may be a reflection preventing film such as a $TiO_2$, or a composite layer compounded of material such as a $TiO_2$. When the light transmission prevention capability of the $p^+$-type region 122 in the hole 130 is enhanced in accordance with the intensity of light 131, a silicide film 140 such as a titanium silicide film is formed on the surface of the $p^+$-type region 122.

Figure 10:
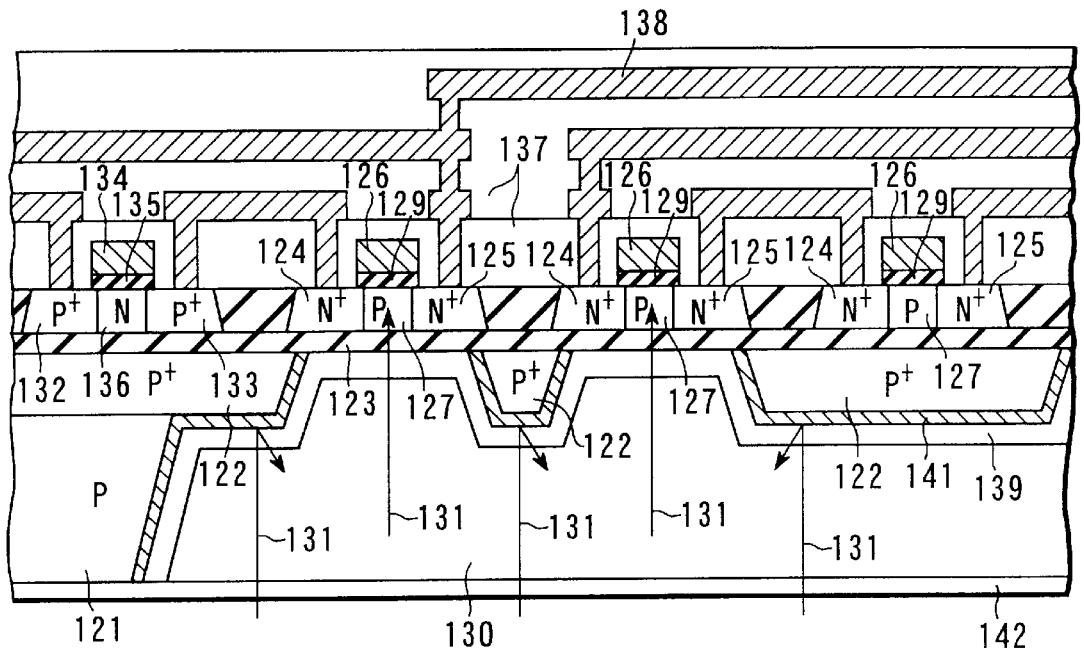
FIG. 10 is a sectional view showing a state of the semiconductor device according to the third embodiment of the present invention after anisotropic etching.

As shown in FIG. 10, to enhance the light transmission prevention capability of the $p^+$-type region 122 in the hole 130, the surface of the $p^+$-type region 122 is plated with a metal (alloy) 141 such as copper. The resultant device is mounted on a case or the like. If necessary, a protective film such as a transparent film 142 is formed above the hole 130 to protect the photoreceptor portion from dust and the like.

Figure 11:
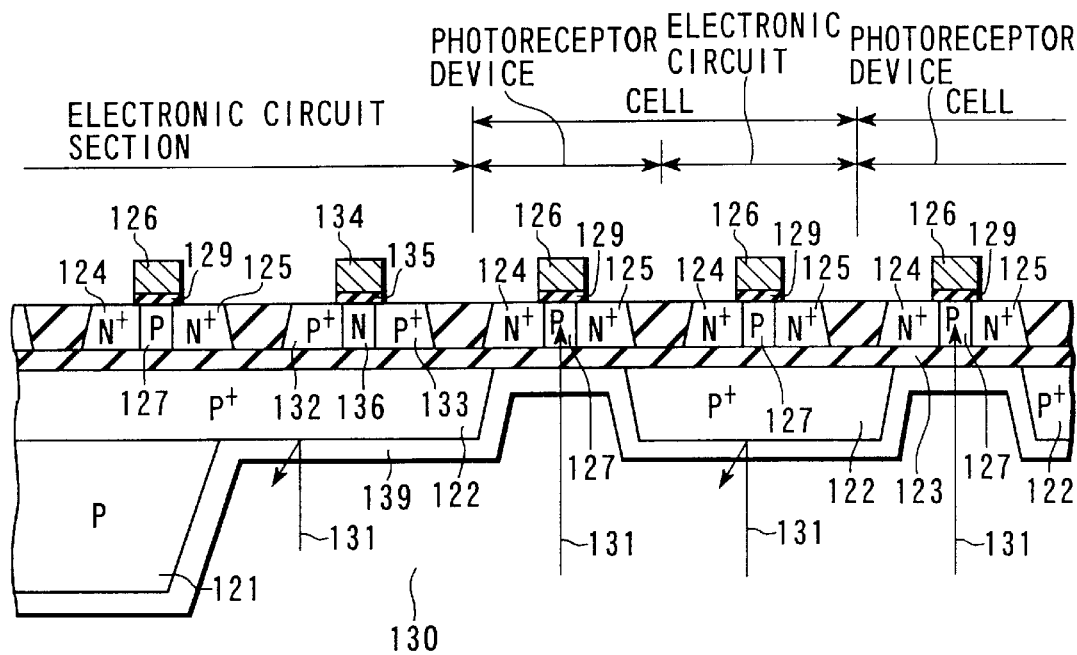
FIG. 11 is a sectional view showing an LSI in which cells (photoreceptor devices+electronic circuits) are arrayed.

FIG. 11 is a sectional view showing an LSI in which cells (photoreceptor devices+electronic circuits) are arrayed. Note that no multilevel interconnection is illustrated. Full depletion MOS transistors as photoreceptor devices arranged in a mesh-like shape are parallel-connected by a multilevel interconnection. Even if the optical path of a light beam shifts slightly, the transistors pose no problem and easily, economically mounted.

As the photoreceptor device, the full depletion MOS transistor may be replaced with a partial depletion MOS transistor, a Schottky diode, a p-n junction diode, a bipolar transistor, or a PIN diode.

In the third embodiment, one large hole is formed, and a plurality of semiconductor devices are formed on the insulating film corresponding to the portion where the large hole is formed. This structure is also applied to embodiments to be described below.

For example, the sixth embodiment will exemplify a semiconductor device in which light is incident on the photoreceptor device of a MOS sensor via a hole formed in the lower surface of a semiconductor substrate. In this embodiment, a plurality of photoreceptor devices of the MOS sensor are formed on the insulating film corresponding to the portion where one photoreception hole is formed. A light-shielding layer such as a $p^+$-type layer is formed on semiconductor devices except for photoreceptor devices.

<Fourth Embodiment>

FIG. 12A is a sectional view showing a semiconductor device according to the fourth embodiment of the present invention. FIG. 12B is an equivalent circuit diagram of one MOS transistor in the semiconductor device shown in FIG. 12A.

In FIG. 12A, the same reference numerals as in FIG. 5 denote the same parts, and a description thereof will be omitted.

In FIGS. 12A and 12B, reference numeral 191 denotes a polysilicon resistor; 192, an electret film as an example of a conductive film; 193, sound; and 194, an electrode of the electret film. Reference symbol C denotes a capacitor; R, a resistor; and FET, a field effect MOS transistor made up of a gate G, a drain D, and a source S.

More specifically, a CMOS/SIMOX LSI is manufactured using an SIMOX substrate, and the lower surface is polished to decrease the thickness of the wafer to, e.g., about 200 µm.

A p-type silicon layer 121 on the lower surface almost immediately below a MOS transistor used as a sound-electric signal conversion device is removed using an anisotropic etching solution. As the etching solution, a dimethylamine solution or a KOH-based solution is available. At this time, no buried $SiO_2$ insulating layer 123 is etched, and a $p^+$-type region 122 having a low etching rate is left.

The $p^+$-type region 122 is connected to a gate electrode 126 of the upper MOS transistor by a metal interconnection 138 during the LSI manufacture. The metal interconnection 138 is formed by, e.g., a conventional multilevel interconnection formation technique.

A resistor 191 is formed between the p-type silicon layer 121 of the substrate and the gate electrode 126 of the upper MOS transistor during the LSI manufacture. The resistor 191 is formed by a conventional method using a polysilicon layer or a single-crystal silicon layer on the buried $SiO_2$ insulating layer 123.

An electret film 192 is adhered to the opening portion of a hole 130 in the lower surface, and the p-type silicon layer 121 is electrically connected to an electrode 194 of the electret film 192.

The electret film 192 has holes (not shown) for flowing gas between the inside and outside. These holes make the internal and external pressures equal to each other. The electret film 192 and the p+-type region 122 constitute the capacitor C. By the above method, the sound-electric signal conversion device is incorporated in the LSI. FIG. 12B shows an electrically equivalent circuit having this structure. That is, the gate G of the field effect MOS transistor is parallel-connected to the resistor R as the polysilicon resistor 191, and the capacitor C made up of the electret film 192 and the p+-type region 122.

As described above, MOS transistors for a sound-electric signal conversion circuit are arrayed and parallel-connected to each other. Since the sound 193 is detected by the capacitor made up of the electret film 192 and the p+-type region 122 in the hole 130 in the lower surface, a multilevel interconnection made up of three or more layers can be formed on the MOS transistors for a sound-electric signal conversion circuit.

Note that the surface of the p+-type region 122 is silicided or plated with a metal.

Since sound-electric signal conversion devices are integrally mounted on one LSI chip in the fourth embodiment, the mounting area is greatly reduced to ½ or less. Portable telephones are being reduced in size and weight, and even wristwatch type telephones are developed. To reduce the size and weight of such a portable telephone, the semiconductor device of the fourth embodiment is very effective.

In the above embodiments, n- and p-channels may be replaced with each other.

The silicon substrate as an SOI substrate may be of the n type. In this embodiment, the SIMOX substrate is used as an SOI substrate. However, for example, the SOI substrate may be a substrate which is formed by using a wafer bonding and a polishing techniques and an ELTRAN substrate which is formed by using a porous semiconductor layer.

According to the present invention, a semiconductor device in which a multilevel interconnection can be formed without considering the sound input path by inputting sound to the photoreceptor device from the side opposite to the multilevel interconnection side.

<Fifth Embodiment>

FIG. 13 is a sectional view showing a semiconductor device according to the fifth embodiment of the present invention.

In FIG. 13, reference numeral 221 denotes an Si substrate; 222, an $SiO_2$ film; 223, an n-type or intrinsic silicon layer; 224, a Schottky electrode; 225, a Schottky junction; 226, a first metal electrode; 227, a second metal electrode; 228, an n+-type region; 229, light; and 230, a hole.

In a silicon-thin-layer island within a silicon semiconductor substrate island having an SOI structure made up of the Si substrate 221 and the $SiO_2$ film 222, the Schottky junction 225 is formed between the Schottky electrode 224 connected to the first metal electrode 226, and the n-type or intrinsic silicon layer 223.

The n+-type region 228 and the second metal electrode 227 connected to it are formed adjacent to the first metal electrode 226. The n-type or intrinsic silicon layer 223 is electrically connected from the lower portion of the first metal electrode 226 to the n+-type region 228.

The hole 230 is formed by etching away part or all of silicon on the side opposite to the electrode interconnection. The hole 230 allows irradiation of the light 229 on the depleted n-type or intrinsic silicon layer 223 via the $SiO_2$ film 222 from the side opposite to the Schottky junction 225 of the diode. The light 229 is output from the second metal electrode 227 as an output terminal.

In the above way, the Schottky diode is formed on the single-crystal silicon layer having an SOI structure, the single-crystal silicon portion of the substrate opposing the Schottky junction surface is etched away, and light is directly incident on the depletion region of the Schottky diode from the substrate side.

In actual use, light can be converted into an electric signal such that the diode is reversely biased, and charges generated in the depletion layer region upon irradiation of light are detected as an electric signal. Compared to irradiation of light on the upper surface of a conventional substrate, the fifth embodiment has the following features.

1) The conversion efficiency can be increased because light irradiation can be performed without any obstacle.

2) The n+-type region can be made small because of an SOI structure, and the parasitic capacitance of the signal output terminal can be reduced, thereby increasing the detection sensitivity.

3) The substrate may not be conductive by forming the hole in the substrate over the n+-type region, and the parasitic capacitance can be reduced.

From the viewpoint of the photoelectric conversion efficiency, the efficiency can be increased and the features can be further improved by adjusting the thickness of the silicon layer having an SOI structure within the depletable range.

FIG. 14 is a sectional view showing another structure of the semiconductor device according to the fifth embodiment of the present invention. In FIG. 14, the same reference numerals as in FIG. 13 denote the same parts, and a description thereof will be omitted.

In FIG. 14, an impurity 231 capable of forming impurity level is doped by, e.g., an ion implanter in the region of the n-type or intrinsic silicon layer 223 on the semiconductor side of the Schottky junction 225.

With this structure, the photoelectric conversion efficiency can be increased. The semiconductor device can react to light having a longer wavelength, and the photoelectric conversion application range can be widened.

Figure 15A:
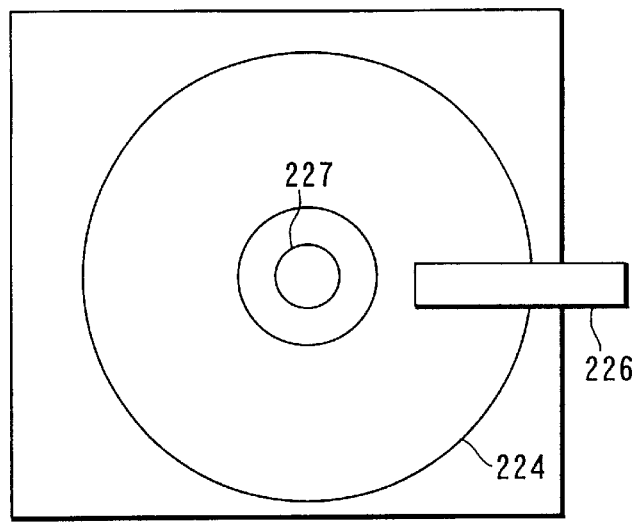
FIG. 15A is a plan view showing still another semiconductor device according to the fifth embodiment of the present invention.
Figure 15B:
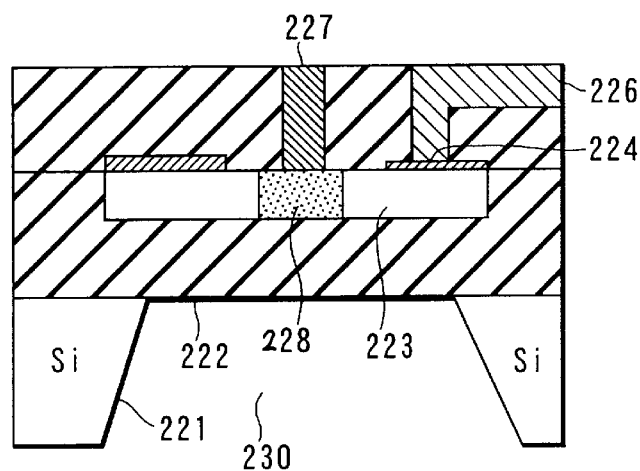
FIG. 15B is a sectional view showing the semiconductor device according to the fifth embodiment.

FIG. 15A is a plan view showing still another semiconductor device according to the fifth embodiment of the present invention. FIG. 15B is a sectional view showing the semiconductor device according to the fifth embodiment.

In FIGS. 15A and 15B, the same reference numerals as in FIG. 13 denote the same parts, and a description thereof will be omitted.

More specifically, the Schottky electrode 224 has a concentric doughnut shape, and the concentric n+-type region 228 is formed in the central space. With this structure, this semiconductor device can further have the following features.

1) Since the n+-type electrode can be made small, the parasitic capacitance of can be reduced, thereby increasing the optical signal detection sensitivity.

2) Silicon of the substrate opposing the n+-type region is removed, thereby increasing the optical signal detection sensitivity.

3) The volume of the depletion layer can be increased while the distance between electrodes is kept small, thereby increasing the photoelectric conversion efficiency.

Note that the Schottky electrode 224 and the n+-type region 228 have a concentric shape in FIGS. 15A and 15B, but the same effects can also be obtained by a square or polygonal shape.

Figure 16:
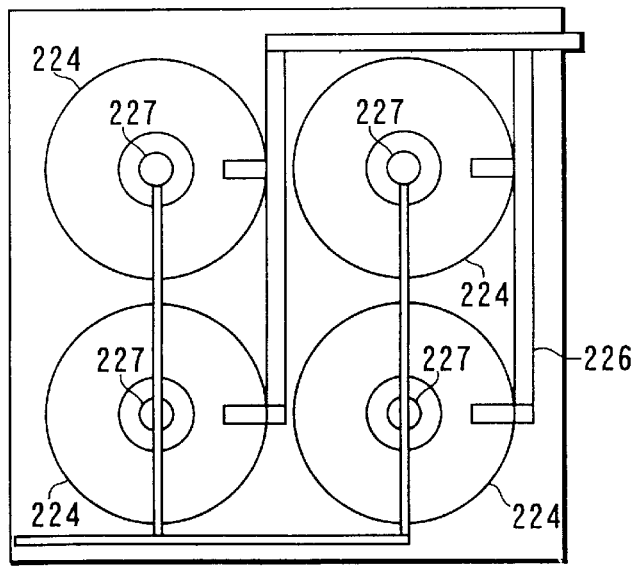
FIG. 16 is a plan view showing still another semiconductor device according to the fifth embodiment of the present invention.

FIG. 16 is a plan view showing still another semiconductor device according to the fifth embodiment of the present invention.

In FIG. 16, the same reference numerals as in FIG. 13 denote the same parts, and a description thereof will be omitted.

More specifically, Schottky diodes like the one shown in FIGS. 15A and 15B are two-dimensionally arrayed on a silicon semiconductor substrate having an SOI structure, and their Schottky electrodes 224 are commonly connected.

The second metal electrodes 227 formed in the n⁺-type regions are commonly connected to parallel-connect the diodes. Silicon on the lower surface is etched away to allow irradiation of light on the depleted n-type or intrinsic silicon layer via SiO₂ from the side opposite to the Schottky junction of the diode. The second metal electrodes 227 commonly connected to the n⁺-type regions are used as output terminals.

Note that Schottky diodes like the one shown in FIGS. 15A and 15B may be one-dimensionally arranged on a silicon semiconductor substrate having an SOI structure.

The semiconductor device is obtained by parallel-developing Schottky diodes like the one shown in FIGS. 15A and 15B (in this case, the 2×2 array is exemplified, but the same effects can also be obtained by an M×N array). While the operation speed is kept high, the detection signal amount can be increased.

As shown in FIG. 16, the parasitic capacitance can also be reduced by the layout in which two diode electrodes do not cross each other. When a multilevel interconnection can be used as an integrated circuit, the parasitic capacitance can be reduced by using an upper interconnection as a signal extraction electrode interconnection.

Figure 17A:
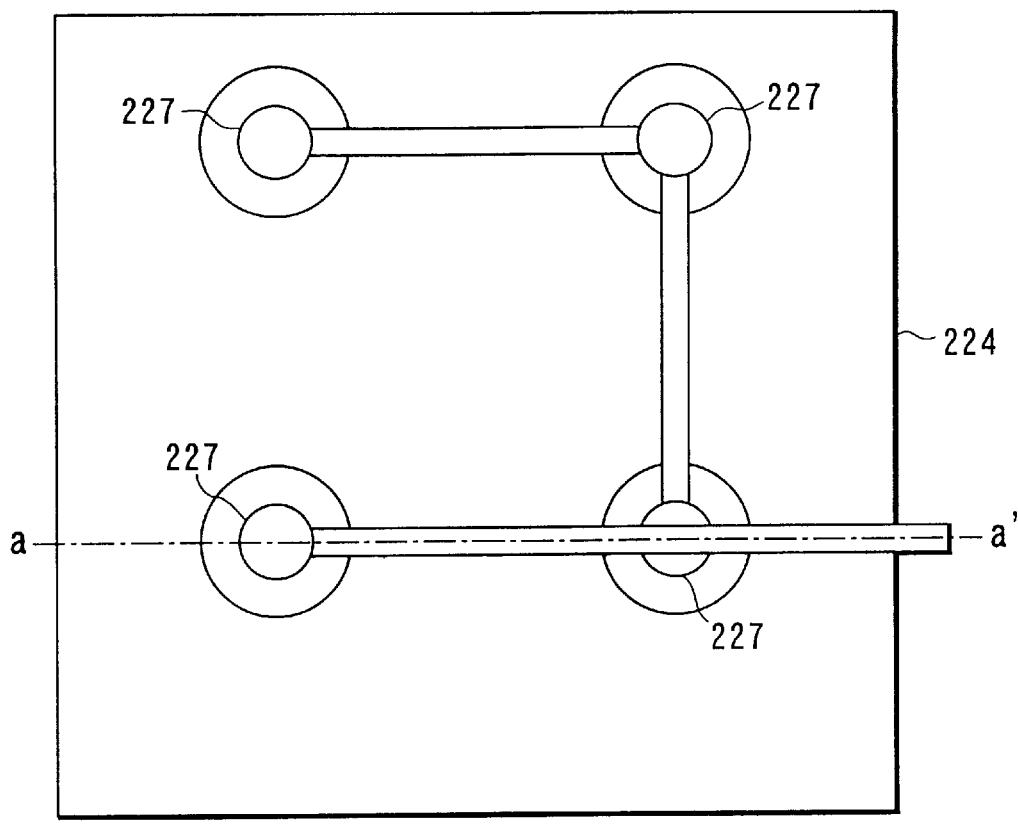
FIG. 17A is a plan view showing still another semiconductor device according to the fifth embodiment of the present invention.
Figure 17B:
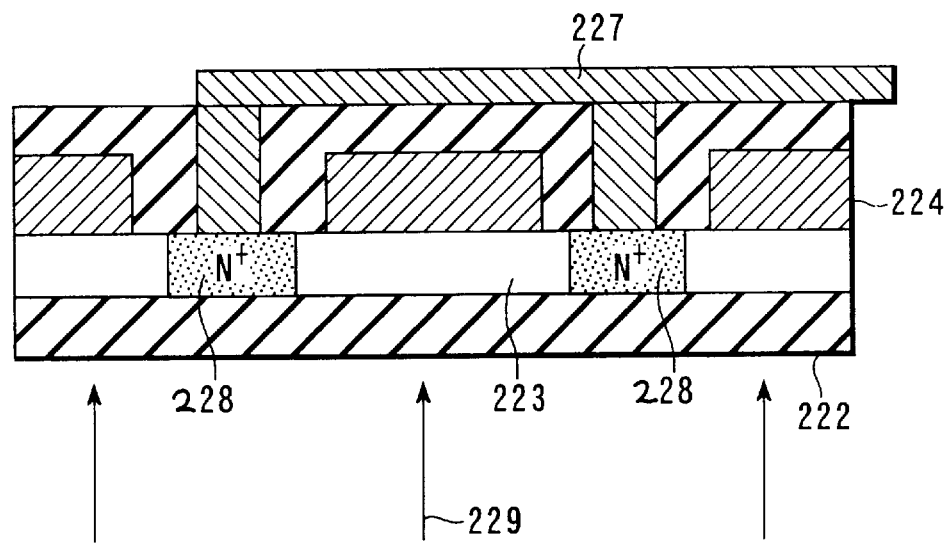
FIG. 17B is a sectional view of the semiconductor device shown in FIG. 17A taken along the line a–a'.

FIG. 17A is a plan view showing still another semiconductor device according to the fifth embodiment of the present invention. FIG. 17B is a sectional view of the semiconductor device shown in FIG. 17A taken along the line a–a'. In FIGS. 17A and 17B, the same reference numerals as in FIG. 13 denote the same parts, and a description thereof will be omitted.

The second metal electrodes 227 formed in the n⁺-type regions 228 are arranged in a 2×2 array. The Schottky electrode 224 is applied to the entire surface except for the second metal electrodes 227 formed in the n⁺-type regions 228 with predetermined intervals, and used as a Schottky diode contributing to photoelectric conversion.

The second metal electrodes 227 formed in the n⁺-type regions 228 are commonly connected to equivalently function as a single diode.

Note that the 2×2 array is exemplified, but the same function can be attained even by an M×N array. This modification has the following features.

1) The area of the Schottky junction can be maximized, and the photoelectric conversion efficiency can be increased.

2) Since a large-area photoreceptor device can be formed, no high precision is required for adjustment of the optical axis as far as the area of the photoreceptor device is larger than the diameter of light upon reception.

Figure 18:
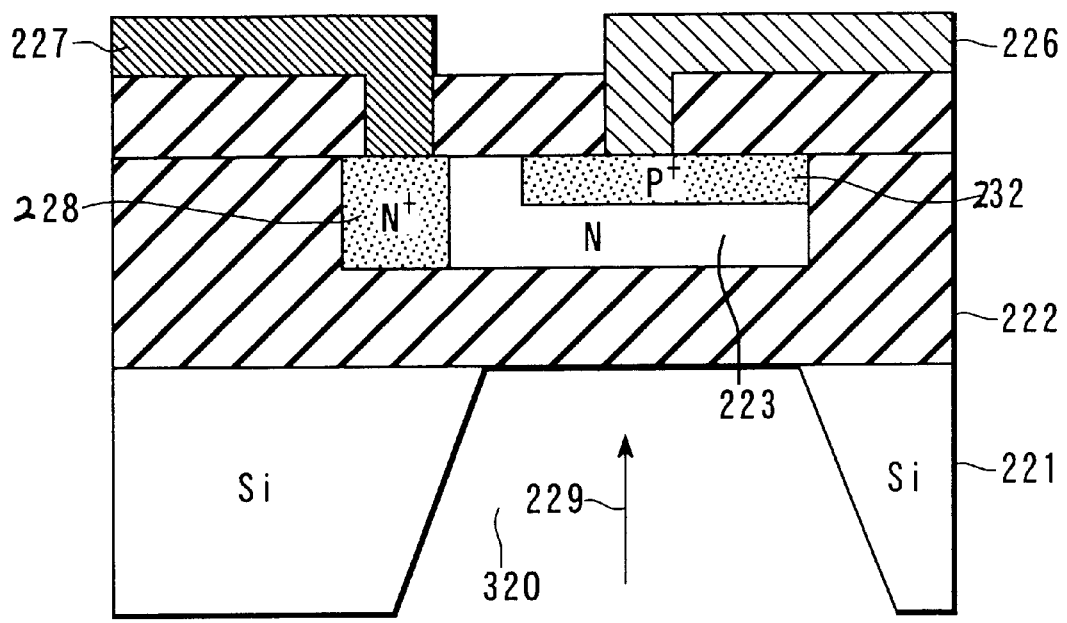
FIG. 18 is a sectional view showing still another semiconductor device according to the fifth embodiment of the present invention.

FIG. 18 is a sectional view showing still another semiconductor device according to the fifth embodiment of the present invention. In FIG. 18, the same reference numerals as in FIG. 13 denote the same parts, and a description thereof will be omitted.

In FIG. 18, reference numeral 232 denotes a p⁺-type region. In a silicon-thin-layer island within a silicon semiconductor substrate island having an SOI structure, a p-n junction diode is formed between the p⁺-type region 232 connected to the first metal electrode 226, and the n-type or intrinsic silicon layer 223.

The n⁺-type region 228 is formed adjacent to the first metal electrode 226 and connected to the second metal electrode 227.

The n-type or intrinsic silicon layer 223 is electrically connected from the lower portion of the first metal electrode 226 to the n⁺-type region 228.

The hole 230 is formed by etching away part or all of silicon on the side opposite to the electrode interconnection. The hole 230 allows irradiation of the light 229 on the depleted n-type or intrinsic silicon layer 223 via the SiO₂ film 222 from the side opposite to the p-n junction diode. The light 229 is output from the second metal electrode 227 as an output terminal.

According to this modification, even in the structure using a p-n junction diode instead of the Schottky diode shown in FIG. 13, the same photoelectric conversion can be implemented.

Figure 19:
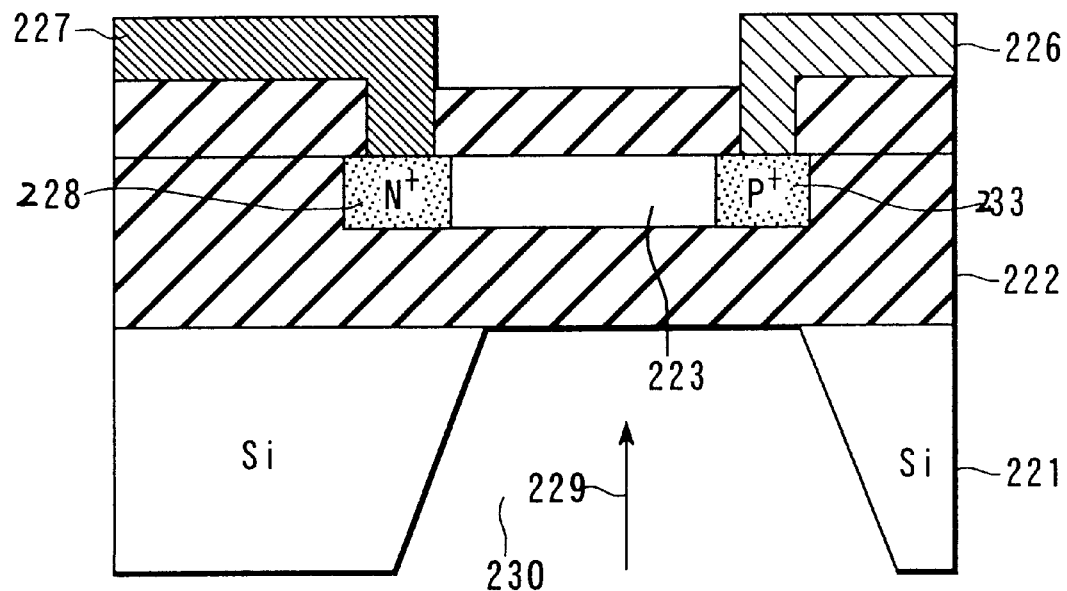
FIG. 19 is a sectional view showing still another semiconductor device according to the fifth embodiment of the present invention.

FIG. 19 is a sectional view showing still another semiconductor device according to the fifth embodiment of the present invention. In FIG. 19, the same reference numerals as in FIG. 13 denote the same parts, and a description thereof will be omitted.

In FIG. 19, reference numeral 233 denotes a p⁺-type region. In a silicon-thin-layer island within a silicon semiconductor substrate island having an SOI structure, a p-n junction diode having a lateral structure is formed between the p⁺-type region 233 connected to the first metal electrode 226, and the n-type or intrinsic silicon layer 223.

The n⁺-type region 228 is formed adjacent to the first metal electrode 226 and connected to the second metal electrode 227. The n-type or intrinsic silicon layer 223 is electrically connected from the lower portion of the first metal electrode 226 to the n⁺-type region 228.

The hole 230 is formed by etching away part or all of silicon on the side opposite to the electrode interconnection. The hole 230 allows irradiation of the light 229 on the depleted n-type or intrinsic silicon layer 223 via the SiO₂ film 222 from the side opposite to the p-n junction diode. The light 229 is output from the second metal electrode 227 as an output terminal.

According to this modification, even in the structure using a p-n junction diode having a lateral structure instead of the Schottky diode shown in FIG. 13, the same photoelectric conversion can be implemented.

Figure 20:
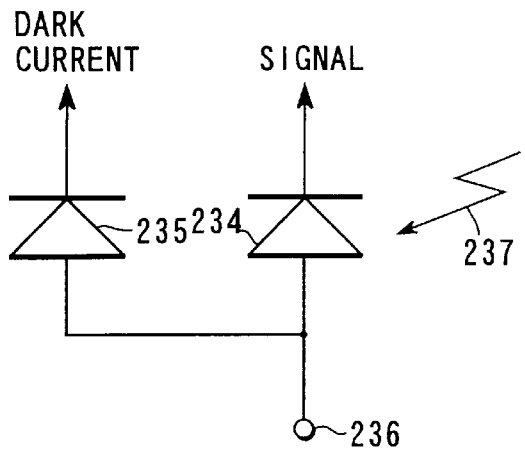
FIG. 20 is a circuit diagram showing a diode used as a photoelectric conversion device in the semiconductor device according to the fifth embodiment.

FIG. 20 is a circuit diagram showing a diode used as a photoelectric conversion device in the semiconductor device according to the fifth embodiment.

In FIG. 20, reference numeral 234 denotes a diode having a structure to be irradiated with light; 235, a diode having a structure not to be irradiated with light; 236, a power source; and 237, light.

The anode of the diode 234 having a structure to be irradiated with light from the substrate side, and the anode of the diode 235 having a structure not to be irradiated with light from the substrate side are commonly connected to the power source 236. A signal including a dark current is detected from the cathode of the diode 234.

The dark current is detected from the cathode of the diode 235, and a signal including no dark current is detected by subtracting the dark current obtained from the diode 235, from the signal including the dark current which is obtained from the diode 234. This enables high-precision photoelectric conversion.

As described above, two photoelectric conversion diodes are arranged close to each other. As described above, one of the diodes is given a normal photoelectric conversion function by light irradiation from the substrate side. The other is given a structure capable of equivalently obtaining a dark current as a signal under no light by leaving the substrate unetched or adding a light-shielding function even if the substrate is etched. Actual photoelectric conversion uses the difference between two outputs. This yields the following effects.

1) Even for a weak signal, light can be accurately converted into an optical signal by subtracting a dark current when the diode does not receive an optical signal, from a photoelectrically converted signal by a circuital method.

2) The diode characteristics vary with temperature variations. The temperature characteristics can be corrected using the difference between the diodes having the same shape.

Figure 21:
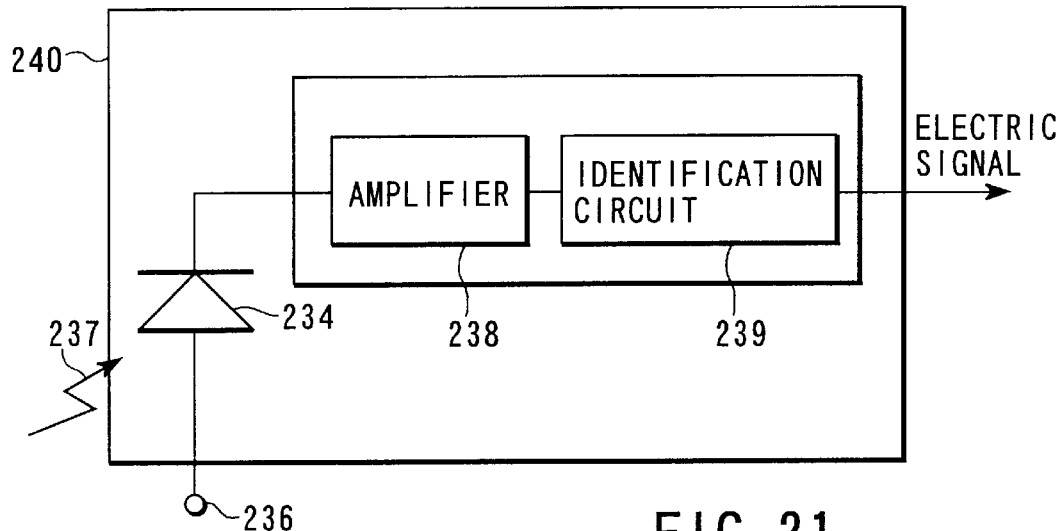
FIG. 21 is a circuit diagram showing still another semiconductor device according to the fifth embodiment of the present invention.

FIG. 21 is a circuit diagram showing still another semiconductor device according to the fifth embodiment of the present invention.

In FIG. 21, reference numeral 234 denote a diode having a structure to be irradiated with light; 236, a power source; 237, light; 238, an amplifier; 239, an identification circuit; and 240, a semiconductor integrated circuit.

The anode of the diode 234 having a structure to be irradiated with the light 237 is connected to the power source 236, and the cathode of the diode 234 is connected to the input terminal of the amplifier 238. The output terminal of the amplifier 238 is connected to the input terminal of the identification circuit 239. From the output terminal of the identification circuit 239, an electric signal is extracted.

The diode 234, the amplifier 238, and the identification circuit 239 are formed on the silicon semiconductor substrate having an SOI structure.

In this manner, the amplifier 238 and the identification circuit 239 are mounted on the same chip as the photoelectric conversion diode 234. They can be easily formed on the same chip because any diode of the present invention is formed on an SOI substrate, and both the amplifier 238 and the identification circuit 239 are constituted by MOS or bipolar transistor circuits using silicon. The semiconductor device of this modification has the following features.

1) Since the photoelectrically converted signal terminal and the input terminal of the amplifier can be arranged close to each other, the parasitic capacitance can be reduced, and a high-performance, low-power photoreception integrated circuit can be realized.

2) A small-size device can be realized with one chip using the most advanced semiconductor technique, and as a result, economical advantages and power reduction can be simultaneously attained.

If a plurality of basic circuits like the one shown in FIG. 21 are arranged and developed to a one- or two-dimensional array on a silicon semiconductor substrate having an SOI structure, large-capacity optical signal transmission can be efficiently performed, and boards can be connected by an optical signal.

The basic circuits require a means for preventing interference of light between them. This means can be realized by, e.g., a silicon island or a metal-covered silicon island.

The amplifier 238 amplifies a signal output from the diode 234. The identification circuit 239 shapes the waveform of the signal amplified by the amplifier 238.

In the above embodiments, n- and p-channels may be replaced with each other.

According to the present invention, a semiconductor integrated circuit in which the photoelectric conversion efficiency of the photoreceptor device can be increased by etching away part of all of silicon on the side opposite to the electrode interconnection and entering light into the photoreceptor device can be provided.

<Sixth Embodiment>

Figure 22:
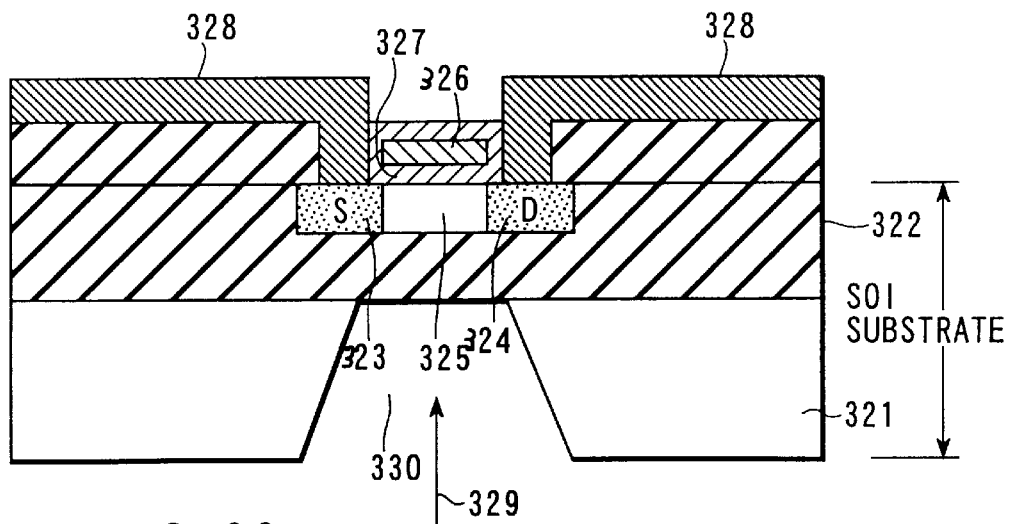
FIG. 22 is a sectional view showing a photoelectric conversion device serving as a basic circuit according to the sixth embodiment of the present invention.

FIG. 22 is a sectional view showing a photoelectric conversion device serving as a basic circuit of a semiconductor device according to the sixth embodiment of the present invention.

In FIG. 22, reference numeral 321 denotes an Si substrate; 322, an $SiO_2$ film; 323, a source region; 324, a drain region; 325, a depletion layer; 326, a gate electrode; 327, a gate insulating film; 328, a metal interconnection; 329, light; and 330, a hole.

A MOS transistor made up of the source region 323, the drain region 324, the depletion layer 325, the gate electrode 326, and the gate insulating film 327 is formed on a substrate having an SOI structure made up of the Si substrate 321 and the $SiO_2$ film 322.

The hole 330 is formed by etching away silicon on the lower side of the transistor channel. The channel region of the depletion layer 325 is irradiated with light via the hole 330 from the lower side opposite to the metal interconnection 328.

Then, charges generated in the depletion layer 325 upon irradiation of light change the current of the transistor and convert light into an electric signal.

Note that stable characteristics can be obtained by attaching a transparent or small-loss thin film electrode to the light irradiation window and preventing the electric field of ions and the like from influencing the transistor characteristics.

Figure 23A:
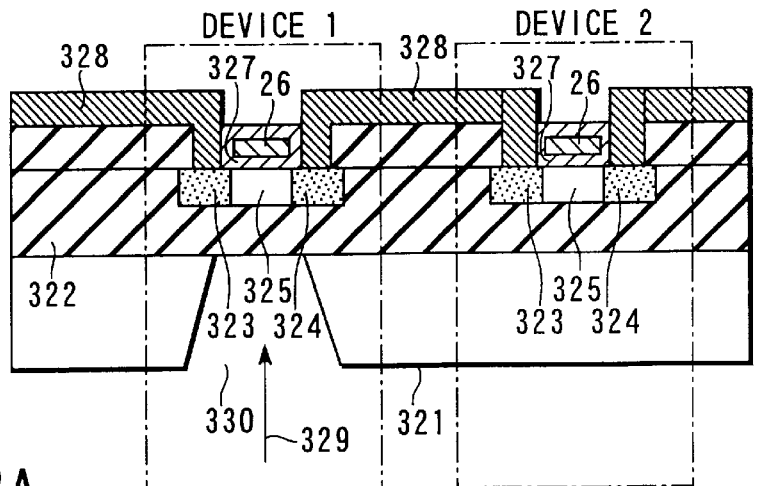
FIG. 23A is a sectional view showing another semiconductor device according to the sixth embodiment of the present invention.
Figure 23B:
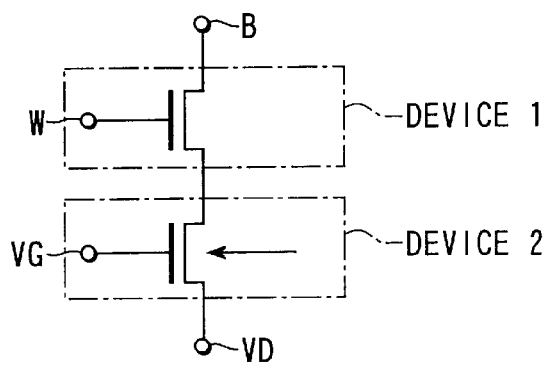
FIG. 23B is an equivalent circuit diagram showing the semiconductor device shown in FIG. 23A.

FIG. 23A is a sectional view showing another semiconductor device according to the sixth embodiment of the present invention. FIG. 23B is an equivalent circuit diagram showing the semiconductor device shown in FIG. 23A. The same reference numerals as in FIG. 22 denote the same parts, and a description thereof will be omitted.

As shown in FIG. 23A, the hole 330 is formed by removing silicon of the Si substrate 321 opposing the channel region of the depletion layer 325.

Device 1 constituted by a MOS transistor with a photoelectric conversion function which allows irradiation of the light 329 on the channel of the depletion layer 325 via the $SiO_2$ film 322, and device 2 constituted by a MOS transistor with no photoelectric conversion function are arranged adjacent to each other on a silicon semiconductor substrate having an SOI structure.

Devices 1 and 2 are electrically series-connected, and the two, gate and unconnected source or drain terminals of each of devices 1 and 2 are individually extracted by the metal interconnection 328.

Device 1 with a photoelectric conversion function shown in FIG. 22, and device 2 with no general photoelectric conversion function are arranged in adjacent regions on an SOI substrate. The drain terminal of device 1 is series-connected to the source terminal of device 2. Device 1 is given a photoelectric conversion function, whereas device 2 is given signal read and holding functions.

The source terminal of device 1 is connected to a power source terminal $V_D$, and the gate terminal of device 1 is connected to a power source $V_G$. The drain terminal of device 2 is connected to a bit line B, and the gate terminal of device 2 is connected to a word line W.

In this structure, since light can be incident on the region of the depletion layer 325 without any obstacle, a high photoelectric conversion efficiency can be obtained. In addition, since a signal is not read via multistage pixels, unlike the CCD, but is directly transferred from each pixel to the signal detector, defects of intermediate pixels do not influence other pixels.

In FIG. 23B, the transistor with a photoelectric conversion function is arranged on the lower side, but the same function can be attained even on the upper side.

Figure 24:
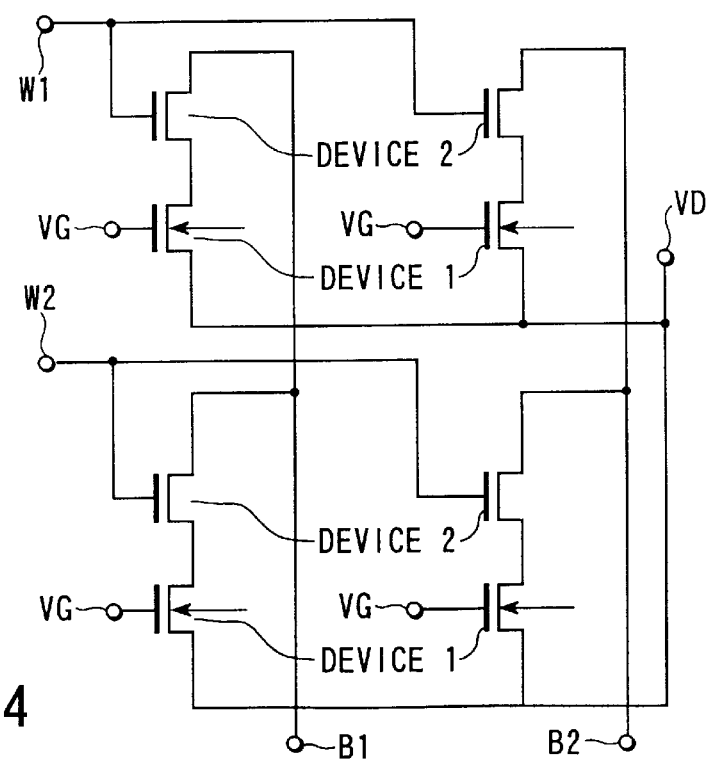
FIG. 24 is a circuit diagram showing still another semiconductor device according to the sixth embodiment of the present invention.

FIG. 24 is a circuit diagram showing still another semiconductor device according to the sixth embodiment of the present invention. FIG. 24 shows the connection relationship between basic circuits like the one shown in FIGS. 23A and 23B which are arranged in a 2×2 matrix.

More specifically, M×N basic circuits each constituted by devices 1 and 2 shown in FIGS. 23A and 23B are arrayed. The source terminals of devices 1 are commonly connected to the power source terminal $V_D$, and the gate terminals of devices 1 are commonly connected to the power source $V_G$. The gates of devices 2 on the first row are commonly connected to a word line $W_1$, and the gates of devices 2 on the second row are commonly connected to a word line $W_2$. The drain terminals of devices 2 on the first column are commonly connected to a bit line $B_1$, and the drain terminals of devices 2 on the second column are commonly connected to a bit line $B_2$.

When the word line $W_1$ is selected, the two upper basic circuits are selected, and data stored in the transistors of devices 1 with a photoelectric conversion function appear on the bit lines $B_1$ and $B_2$ via the transistors of devices 2 with a selection function.

The power source $V_G$ has a potential commonly supplied to the gates of the transistors of devices 1 with a photoelectric conversion function, and is used to control the signal amount. The power source $V_G$ may be fixed to the ground potential. These circuits are formed on the same SOI substrate, and thus can be economically realized with a small size.

Figure 25:
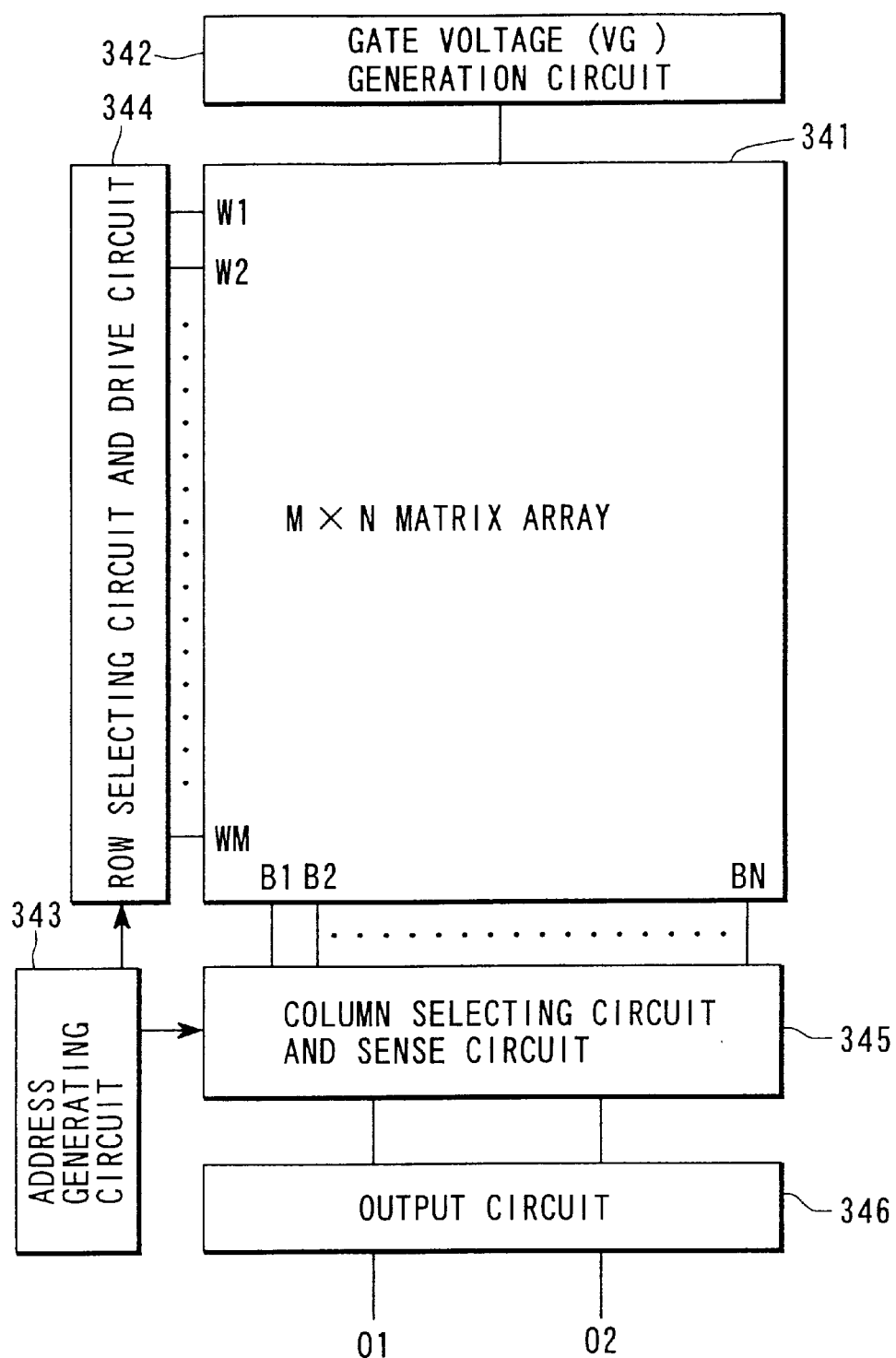
FIG. 25 is a block diagram showing still another semiconductor device according to the sixth embodiment of the present invention.

FIG. 25 is a block diagram showing still another semiconductor device according to the sixth embodiment of the present invention.

Basic circuits each constituted by devices 1 and 2 shown in FIGS. 23A and 23B are arranged in an M×N matrix array 341.

The gates of devices 1 are connected to a gate voltage ($V_G$) generation circuit 342. An address generating circuit 343 and a row selecting circuit 344 for selecting one word line from M word lines $W_1, W_2, \ldots, W_M$ are arranged.

The drive circuit 344 for driving the word lines $W_1, W_2, \ldots, W_M$ is electrically connected to the word lines, while N bit lines $B_1, B_2, \ldots, B_N$ are electrically connected to a sense circuit 345.

The sense circuit 345 functions to amplify, identify, and hold a signal. The sense circuit 345 is connected to the address generating circuit 343 and a column selecting circuit 345 for designating the output order, and an output circuit 346 having output terminals $O_1$ and $O_2$ for externally extracting a selected signal.

In this modification, the matrix scale is enlarged to M rows and N columns, and functions are integrated as an integrated circuit. The array 341 of M×N basic circuits is arranged at the center. The address generating circuit 343 for selecting one word line from M rows, and the row selecting and M-word-line drive circuit 344 are respectively connected to each of the M word lines $W_1, W_2, \ldots, W_M$.

The N read lines (in this case, the bit lines $B_1, B_2, \ldots, B_N$) are connected to the sense circuit 345 where read data are stored. The stored data are sequentially output via the designated output terminal $O_1$ or $O_2$ under the control of the address generating circuit 343 and the column selecting circuit 345. The number of output terminals can be one or more in accordance with the system specification.

Figures 26A, 26B:
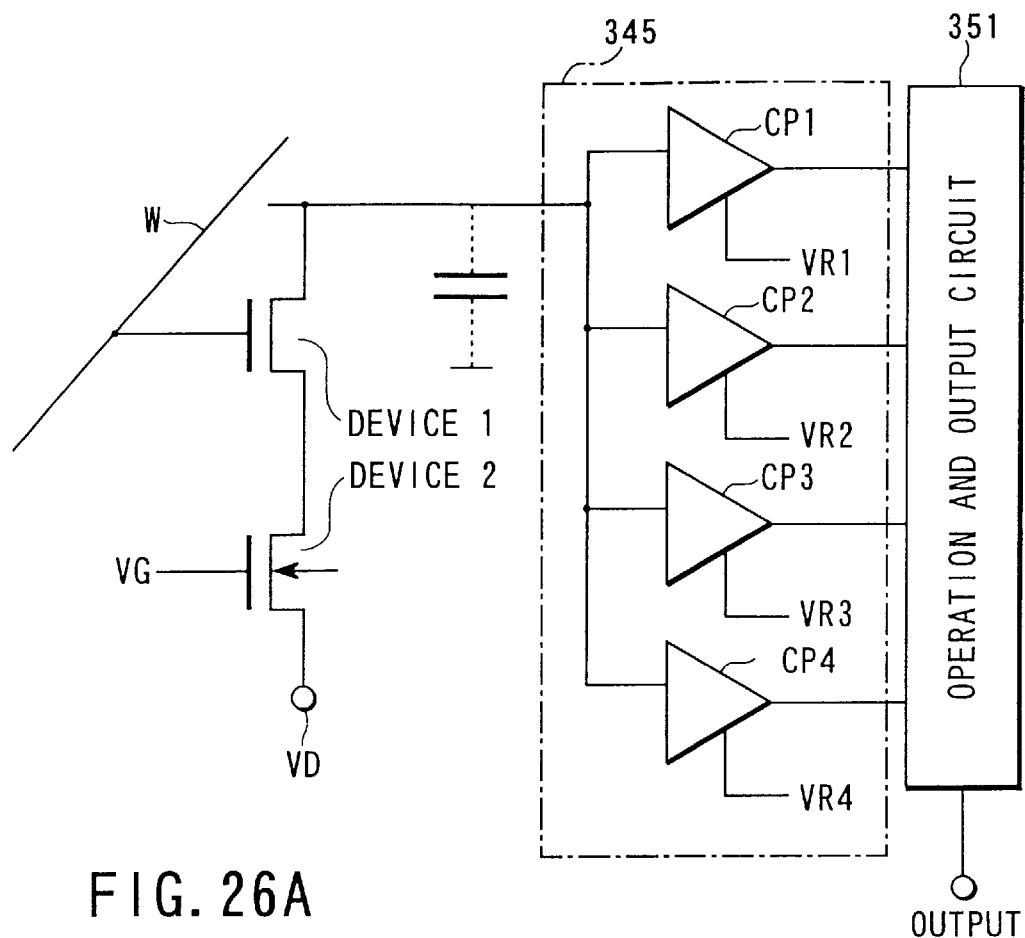
FIG. 26A is a diagram showing still another semiconductor device according to the sixth embodiment of the present invention.
FIG. 26B is a view showing the input level of a sense circuit and an output corresponding to the input level.

FIG. 26A is a diagram showing still another semiconductor device according to the sixth embodiment of the present invention.

As the sense circuit 345 in FIG. 25, one or a plurality of comparators CP1, CP2, CP3, and CP4 are arranged with their inputs commonly connected. The comparators CP1, CP2, CP3, and CP4 are respectively set at different reference levels VR1, VR2, VR3, and VR4. The obtained results are output as desired results by an operation and output circuit 351.

FIG. 26B is a view showing the input level of the sense circuit and an output corresponding to the input level.

This modification exemplifies an identification circuit for converting a read signal into data. In this case, the sense circuit efficiently identifies five outputs "0", "1", "2", "3", and "4". The reference levels VR1, VR2, VR3, and VR4 are prepared in advance and respectively set in the four comparators CP1, CP2, CP3, and CP4.

The comparators CP1, CP2, CP3, and CP4 operate upon reception of level 4, 3, 2, 1, or 0 as a sense circuit input level, the operation results are processed by the operation and output circuit 351, and the read results are output as "4", "3", "2", "1", or "0" in correspondence with the input level.

This modification exemplifies the four comparators. By increasing the number of comparators, information nearer an analog signal can be obtained.

Figure 27A:
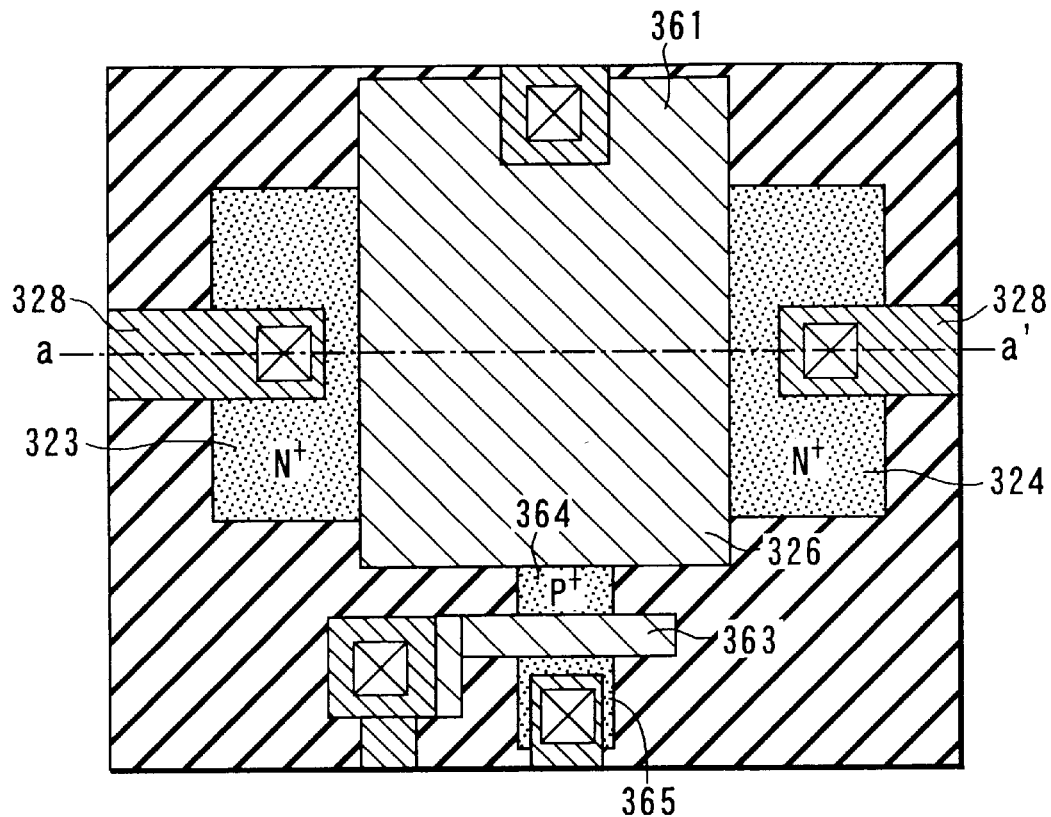
FIG. 27A is a plan view showing still another semiconductor device according to the sixth embodiment of the present invention.
Figure 27B:
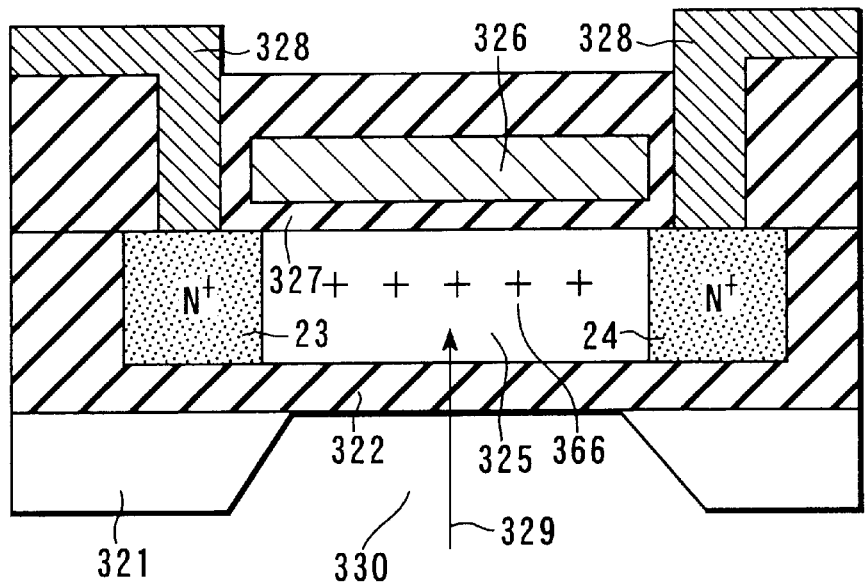
FIG. 27B is a sectional view of the semiconductor device shown in FIG. 27A taken along the line a–a'.

FIG. 27A is a plan view showing still another semiconductor device according to the sixth embodiment of the present invention. FIG. 27B is a sectional view of the semiconductor device shown in FIG. 27A taken along the line a–a'. The same reference numerals as in FIG. 22 denote the same parts, and a description thereof will be omitted.

In FIGS. 27A and 27B, reference numeral 361 denotes an n-channel MOS transistor constituting device 1; 362, a p-channel MOS transistor constituting device 3; 363, a gate electrode; 364, a $p^+$-type source region; 365, a $p^+$-type drain region; and 366, photoelectrically converted charges.

This modification concerns a device structure with a photoelectric conversion function. The n-channel transistor 361 is a partial depletion transistor. When the substrate 321 is irradiated with the light 329 via the hole 330 from the Si substrate 321, the charges 366 are accumulated in the region between the lower portion of the depletion layer 325 and the $SiO_2$ film 322.

The charges 366 function as the back gate of the n-channel MOS transistor 361 and change the conductance of the transistor. Device 1 functions as an active device and thus can amplify a signal, and a smaller-size image sensing device can be realized.

For the n-channel transistor 361, since the subthreshold current is desirably small, the channel length is preferably designed to be slightly larger (about 0.5 to 1 $\mu$m).

To receive the next signal after reading a signal, the stored signal must be reset. The p-channel MOS transistor 362 shown in FIGS. 27A and 27B acts as this reset.

More specifically, while a signal is received and read, the p-channel transistor 362 is in a cutoff state, and the back gate region is isolated. After the signal is read and to be reset, a signal is supplied to the gate electrode 363 of the p-channel MOS transistor 362 to turn on the transistor 362 and discharge the accumulated charges 366.

As a method of partially depleting the n-channel transistor 361, the silicon thin layer is made thick, or the impurity concentration in the region of the depletion layer 325 is controlled.

Even if n- and p-channels in FIGS. 27A and 27B are replaced with each other, the same operation can be attained. The metal interconnection 328 may be formed from a diffusion layer.

Figure 28:
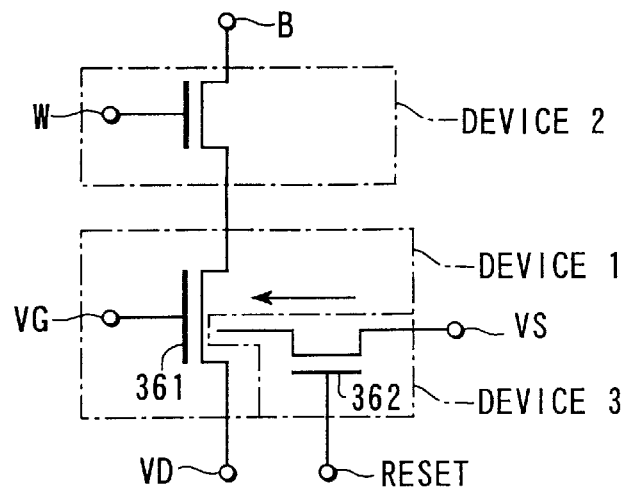
FIG. 28 is a circuit diagram showing still another semiconductor device according to the sixth embodiment of the present invention.

FIG. 28 is a circuit diagram showing still another semiconductor device according to the sixth embodiment of the present invention.

Device 2 constituted by a MOS transistor with no photoelectric conversion function is arranged on a silicon semiconductor substrate having an SOI structure. The circuit made up of devices 1 and 3 shown in FIGS. 27A and 27B is arranged adjacent to device 2.

The drain of the transistor of device 2 is connected to the bit line B, the gate of this transistor is connected to the word line W, and the source of this transistor is connected to the drain of the n-channel MOS transistor 361 of device 1. The gate of the n-channel MOS transistor 361 of device 1 is connected to the power source $V_G$, and the source of the n-channel MOS transistor 361 of device 1 is connected to another power source $V_D$. The gate of the p-channel MOS transistor 362 of device 3 is connected to the RESET terminal, and the terminal extracted as the drain (or source) is connected to still another power source $V_S$.

As described above, devices shown in FIGS. 27A and 27B and device 2 constituted by a general MOS transistor are series-connected on the same SOI substrate to form another basic circuit for an image sensing device.

Since the general MOS transistor functions as a switch, it may be of the n- or p-channel type. According to this modification, an image sensing device capable of stably holding and resetting an electric signal converted from light can be realized. Further, since photoelectric conversion can be implemented by an active device, a small-size image sensing integrated circuit capable of amplifying a signal can be realized.

Figure 29:
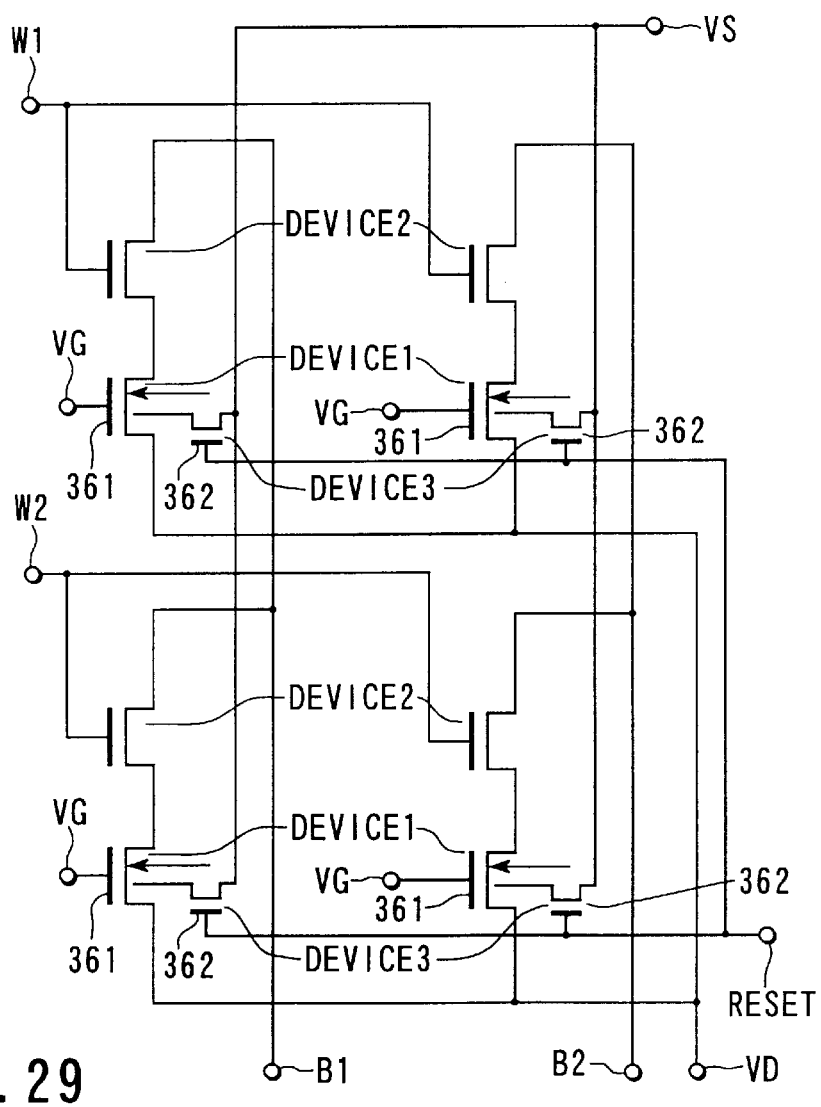
FIG. 29 is a circuit diagram showing still another semiconductor device according to the sixth embodiment of the present invention.

FIG. 29 is a circuit diagram showing still another semiconductor device according to the sixth embodiment of the present invention.

As shown in FIG. 29, basic circuits each constituted by devices 1 to 3 shown in FIG. 28 are arranged in a 2×2 array, and the source terminals of the n-channel MOS transistors 361 of devices 1 are commonly connected to the power source terminal $V_D$.

The gate terminals are commonly connected to the power source $V_G$. The gates of the MOS transistors of devices 2 on the m(1,2)th row are commonly connected to the word lines $W_1$ and $W_2$, and the drain terminals of the MOS transistors of devices 2 on the n(1,2)th column are commonly connected to the bit lines $B_1$ and $B_2$.

The gates of the p-channel MOS transistors 362 of all devices 3 are connected to the RESET terminal commonly or to m RESET terminals corresponding to the word lines. The drains (or sources) of the p-channel MOS transistors 362 of all devices 3 are commonly connected to the power source $V_S$.

In this modification, basic circuits like the one shown in FIG. 28 are arranged in a 2×2 array. The power source $V_G$ is the same as in FIG. 24 and is preferably set at the optimal potential at which the back-gate effect of the transistor appears prominently. The read method is the same as that described with reference to FIG. 24.

After the signal is read, a signal is supplied to the RESET terminal to reset the stored back-gate charges. The RESET signal can be supplied in various manners, e.g., in units of blocks or to the entire chip. The time during which no RESET signal is supplied can be used as a so-called exposure time during which an optical signal is converted into an electric signal.

Figure 30:
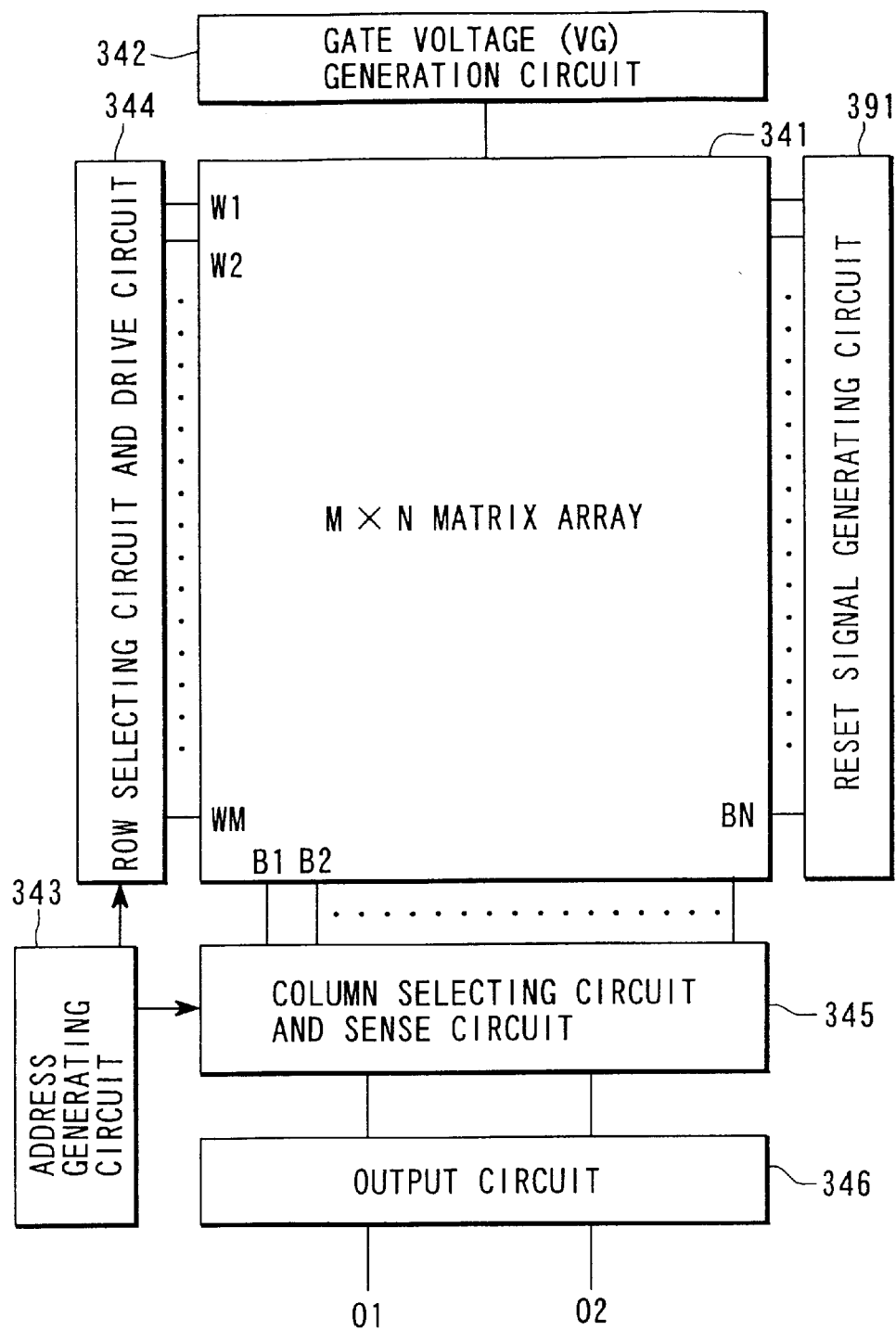
FIG. 30 is a block diagram showing still another semiconductor device according to the sixth embodiment of the present invention.

FIG. 30 is a block diagram showing still another semiconductor device according to the sixth embodiment of the present invention.

As shown in FIG. 30, basic circuits each constituted by devices 1 to 3 shown in FIG. 28 are arranged in an M×N array, and the power source $V_G$ is connected to the gate voltage ($V_G$) generation circuit 342.

The address generating circuit 343 and the row selecting circuit 344 for selecting one word line from the M word lines $W_1, W_2, \ldots, W_M$ are arranged. The drive circuit 344 for driving the word lines $W_1, W_2, \ldots, W_M$ is electrically connected to corresponding word lines, while the N output bit lines $B_1, B_2, \ldots, B_N$ are connected to the sense circuit 345 for amplifying, identifying, and holding a signal.

The sense circuit 345 is connected to the address generating circuit 343 and the column selecting circuit 345 for designating the output order, and the output circuit 346 having output terminals $O_1$ and $O_2$ for externally extracting a selected signal.

The M×N matrix array 341 is connected to a single RESET signal generating circuit 391 via a common RESET terminal or to RESET signal generating circuits 391 arranged in units of word lines.

This modification is related to a block arrangement as an integrated circuit in which the array shown in FIG. 29 has M rows and N columns, and the arrangement is basically the same as that shown in FIG. 25 except for the RESET signal generating circuit 391 added as a function. In this case, the negative phase of the RESET signal can be used as an exposure time.

The present invention does not refer to a clock signal. However, as is well known, a clock is externally supplied to establish image transfer synchronization, and a signal is output in synchronism with the clock.

In the present invention, only one word line is selected. By internally dividing a drive circuit for a corresponding word line into blocks, the sense circuit can be time-divisionally effectively used to reduce the power consumption and the chip area, which is verified by the memory architecture.

As has been described above, according to the present invention, a semiconductor integrated device in which a signal can be directly extracted without being transferred, and the photoelectric conversion efficiency can be increased can be provided.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a silicon layer;

an insulating film formed on said silicon layer;

a first semiconductor device formed on said insulating film for providing an electric signal responsive to light incident thereon; and a second semiconductor device formed on said insulating film, wherein a silicon region having a silicified surface is formed in said silicon layer to shield said second semiconductor device from light, and a through hole is formed in a portion of said silicon layer corresponding to a lower portion of said first and second semiconductor devices, said through hole extending through said silicon layer except for the silicon region to input light to said first semiconductor device.

2. A device according to claim 1 wherein a transparent electrode is formed on the silicified surface of said silicon region and a surface of said insulating film.

3. A semiconductor device comprising:

a silicon layer;

an insulating film formed on said silicon layer;

a plurality of first semiconductor devices formed on said insulating film for providing an electric signal responsive to light incident thereon; and a plurality of second semiconductor devices formed on said insulating film, wherein silicon regions having silicified surfaces are formed in said silicon layer to shield said plurality of second semiconductor devices from light, and a through hole is formed in a portion of said silicon layer corresponding to a lower portion of said pluralities of first and second semiconductor device, said through hole extending through said silicon layer except for the silicon region to input light to said plurality of first semiconductor devices.

* * * * *